(12) United States Patent
Sashida

(10) Patent No.: US 6,501,112 B1
(45) Date of Patent: Dec. 31, 2002

(54) SEMICONDUCTOR DEVICE AND METHOD OF MANUFACTURING THE SAME

(75) Inventor: Naoya Sashida, Kitakami (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/696,012

(22) Filed: Oct. 26, 2000

(30) Foreign Application Priority Data

Jul. 10, 2000 (JP) ........................................ 2000-208778

(51) Int. Cl.[7] .............................................. H01L 31/119
(52) U.S. Cl. ..................... 257/295; 257/296; 257/298; 257/310; 257/535
(58) Field of Search ................................ 257/535, 310, 257/295, 296, 298

(56) References Cited

U.S. PATENT DOCUMENTS

| | | | | |
|---|---|---|---|---|
| 5,475,248 A | * | 12/1995 | Takenaka | ..................... 257/295 |
| 5,745,336 A | * | 4/1998 | Saito et al. | ............... 361/321.5 |
| 5,990,507 A | * | 11/1999 | Mochizuki et al. | ......... 257/295 |
| 6,017,784 A | | 1/2000 | Ohta et al. | |
| 6,046,490 A | * | 4/2000 | Arita et al. | ................. 257/535 |

* cited by examiner

*Primary Examiner*—Richard Elms
*Assistant Examiner*—Douglas Menz
(74) *Attorney, Agent, or Firm*—Arent Fox Kintner Plotkin & Kahn, PLLC

(57) ABSTRACT

A semiconductor device with a transistor having a first impurity region, a second impurity region, and a gate electrode formed on a semiconductor substrate. The semiconductor device also includes a first insulating film covering the transistor, and a capacitor formed on the first insulating film. The capacitor includes a dielectric film formed of either ferroelectric material or high dielectric material, and an upper electrode and a lower electrode positioned to put the dielectric film therebetween. A second insulating film is formed on the capacitor, and a wiring layer is formed on the second insulating film. A nitride film covers the wiring layer and a first silicon oxide film formed on the nitride film includes nitrogen at least at the surface thereof.

14 Claims, 23 Drawing Sheets

40: CONTACT HOLE

31: INTERLAYER INSULATING FILM
32: WIRING
31a, 31c~31e: CONTACT HOLE

33: INTERLAYER INSULATING FILM
34: INTER-REDEPOSITED-LAYER INSULATING FILM

33: INTERLAYER INSULATING FILM
34: INTER-REDEPOSITED-LAYER INSULATING FILM

SEMICONDUCTOR DEVICE AND METHOD OF MANUFACTURING THE SAME

CROSS-REFERENCE TO RELATED APPLICATIONS

This application is based upon and claims Priority on Japanese Patent Application NO.HEI 12-208778, filed on Jul. 10, 2000, the contents being incorporated herein by reference.

BACKGROUND OF THE INVENTION a) Field of the Invention

The present invention relates to a semiconductor device and a method of manufacturing the same. More specifically, the present invention relates to a semiconductor device and a method of manufacturing the same represented by a non-volatile semiconductor memory (FeRAM: Ferroelectric Random Access Memory) using a ferroelectric material for the dielectric film of a capacitor, or a volatile semiconductor memory (DRAM: Dynamic Random Access Memory) using a high dielectric material for the dielectric film of a capacitor, or a LSI system incorporating these memory elements and logic elements.

b) Description of Related Art

In recent years, the use of ferroelectric material for the dielectric film of a capacitor with respect to a FeRAM is attracting attention as a low power consuming non-volatile semiconductor memory. Additionally, the ultra-miniaturization and high integration density of semiconductor memory are more and more in demand. As such, DRAM using a high dielectric material for the ferroelectric film of a capacitor has been developed to satisfy such a demand.

Generally, metal oxide films are used for the ferroelectric material of a FeRAM and for the high dielectric material of a DRAM.

The ferroelectric material and the high dielectric material are easily influenced and easily deteriorate with regard to the polarization characteristic.

Next, the related art of FeRAM will be explained. The related are of FeRAM provides a ferroelectric capacitor formed by sequentially laminating: a lower electrode, for example, consisting of Pt (Platinum); a ferroelectric film consisting of PZT; and a upper electrode consisting of Pt, on the insulation film. An interlayer insulation film is formed to cover the ferroelectric capacitor and an aluminum wiring is then formed thereon. In order to protect these films, a passivation film consisting of a silicon oxide film and a silicon nitride film are then formed.

However, since the pattern of the aluminum wiring is formed thickly in the passivation film of the related art, the level differences of the projection and the recesses at the surface of the passivation film formed thereon is large.

Moreover, when level differences of the projection and the recesses at the surface of the passivation film is large and the interval of aluminum wiring is narrow, a cavity is generated between the wirings. Particularly, in the case where the passivation film is formed with the plasma enhanced CVD method, the level differences of the projection and the recesses at the surface of passivation film is easily increased.

This cavity exists at the region where the wiring interval becomes wide. And on the occasion of forming a contact hole using the resist mask in order to form the pad later, the resist explodes because the gas trapped in the cavity is released at the region near the ending point of the cavity.

SUMMARY OF THE INVENTION

It is therefore an object of the present invention to provide a semiconductor device and a method of manufacturing the same which prevents local explosion of resist formed on the passivation film which is formed on the capacitor using ferroelectric material or high dielectric material, and also prevents deterioration of the capacitor.

One aspect of the present invention provides a semiconductor device comprising a transistor formed on a semiconductor substrate, a capacitor formed on a first insulation film covering the transistor, a wiring layer formed on the capacitor via the second insulation film and a passivation film covering the wiring layer. The passivation film is formed of a first silicon oxide film, a nitride film is formed on the first silicon oxide film, and a second silicon oxide film is formed on the nitride film.

According to the present invention, the cavity formed in the nitride film, used as the passivation film, is covered with a second silicon oxide film. The gas staying in the cavity is not released in the post-process, and thus, the local explosion of resist can be prevented.

In particular, as the second silicon oxide film, a passivation film including the silicon oxide film (TEOS-$O_3$ film) has been formed with ozone ($O_3$) and TEOS using the CVD method.

This TEOS-$O_3$ film assures high coverage and may be formed at the growth temperature as low as 300° C. Therefore, degasification is not generated from the nitride film deterioration of capacitor characteristic. Meanwhile, the silicon oxide film (P-TEOS film) formed using the plasma enhanced CVD method with TEOS gas is inferior for coverage compared to the TEOS-$O_3$ film, and cannot perfectly cover the cavity as explained above. Moreover, since the P-TEOS film is formed at a temperature as high as about 400° C., degasification is generated from the nitride film and deteriorates the capacitor's characteristic.

However, the TEOS-$O_3$ film includes more moisture in the film in comparison with the P-TEOS. film. To eliminating such moisture, the dehydration process of the TEOS-$O_3$ film is executed with plasma annealing, for example, of an $N_2O$ gas or an NO gas in the present invention.

When an electric furnace is used during the heat treatment for dehydration, the annealing in the electric furnace is limited, for example, to the temperature identical to the heat resistant temperature of 450° C. of aluminum because a metal wiring layer is provided as the lower layer of the passivation film. However, sufficient dehydration effect cannot be attained only with such heat treatment. When plasma annealing is performed, as in the case of the present invention, moisture is eliminated from the insulation film at the temperature of 450° C. or less. Therefore, the problem that the metal wiring layer is oxidized will never occur in such a temperature.

Therefore, moisture in the passivation film can be eliminated more effectively with the plasma annealing process in comparison with only heat treatment. Additionally, ferroelectric film and high dielectric film reduction, together with capacitor deterioration resulting from moisture in the passivation film, can be prevented. Thus, high quality FeRAM or DRAM may be manufactured.

According to the plasma annealing of $N_2O$ gas or NO gas, nitrogen is included at least to the surface of the TEOS-$O_3$ film. Nitrogen introduced into the TEOS-$O_3$ film is capable of blocking the entry of moisture from the external side, and thereby, improve the humidity resistance thereof.

DETAILED DESCRIPTION OF THE PREFERRED EMBODIMENT

The preferred embodiment of the present invention will be explained with reference to the accompanying drawings.

FIG. 1 to FIG. 18 are cross-sectional views illustrating, in sequence, the manufacturing process of a semiconductor device as an embodiment of the present invention. In this specification, FeRAM will be used as an example of the semiconductor device of the present invention.

First, the processes for obtaining a cross-sectional structure illustrated in FIG. 1 will be explained.

Figure 1:
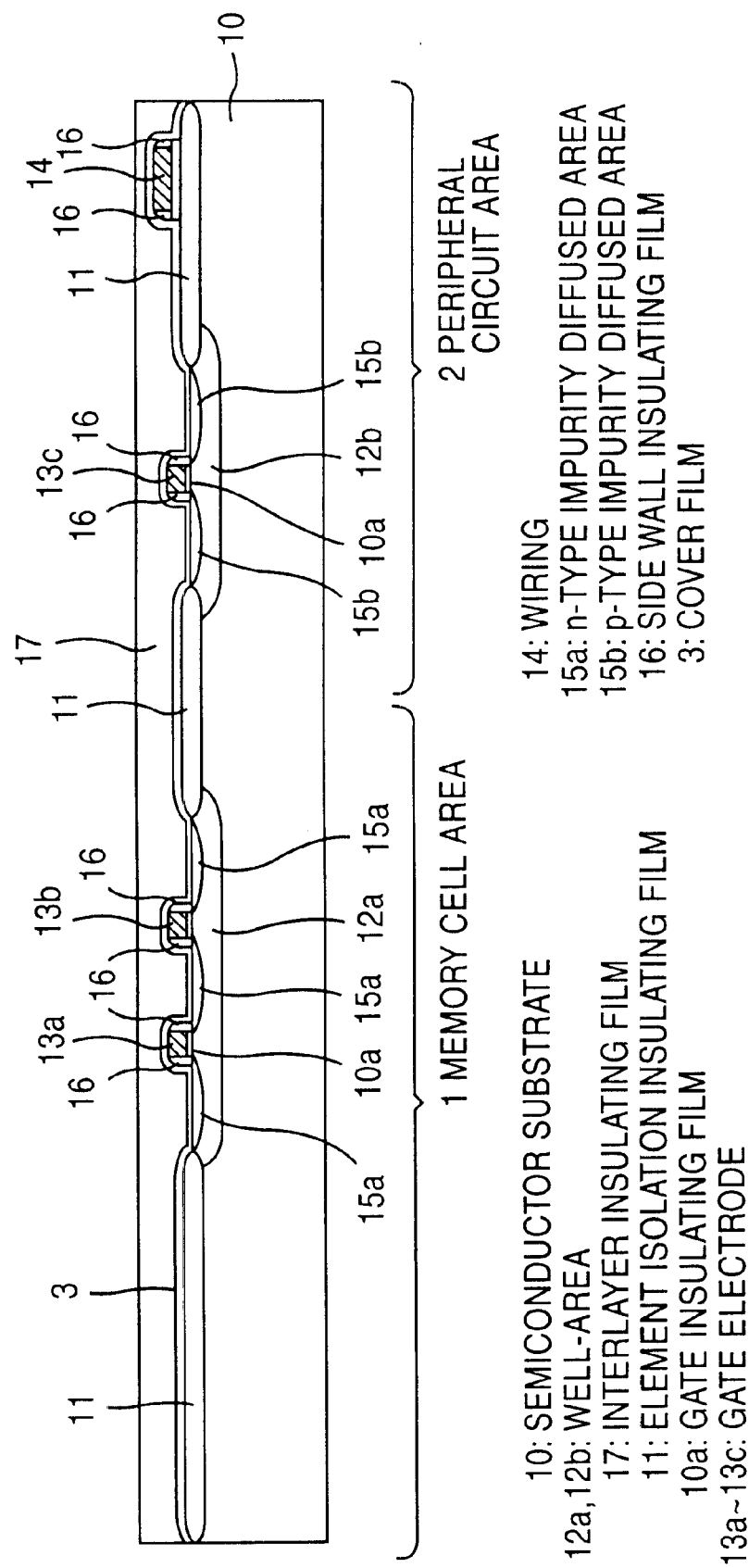
FIGS. 1 to 18 are cross-sectional views illustrating a semiconductor device manufacturing method as the preferred embodiment of the present invention.

Referring to FIG. 1, an element isolation insulating film 11 is selectively formed on the surface of the p-type silicon (semiconductor) substrate 10 by a LOCOS (Local Oxidation of Silicon) method. However, a STI (Shallow Trench Isolation) method may also be used to form the element isolation insulating film 11.

After forming the element isolation insulating film 11, the p-well 12a and the n-well 12b are formed by selectively introducing the p-type impurity and n-type impurity to the predetermined active region (transistor forming region) in the memory cell region 1 and peripheral circuit region 2 of the silicon substrate 10. Although not illustrated in FIG. 1, a p-well is also formed in the peripheral circuit region 2 resulting a CMOS.

Thereafter, the active region surface of the silicon substrate 10 is thermally oxidized to form a silicon oxide film as a gate insulation film 10a.

Next, an amorphous silicon film and a tungsten silicide film are sequentially formed on the entire upper surface of the silicon substrate 10. The amorphous silicon film and the tungsten silicide film are patterned to the predetermined shape, using photolithography to form the gate electrodes 13a to 13c and wiring 14. Here, a polysilicon film may also be formed in place of the amorphous silicon film forming the gate electrodes 13a to 13c.

In the memory cell region 1, a couple of gate electrodes 13a, 13b are arranged in almost in parallel on the p-well 12a and these gate electrodes 13a, 13b form a part of the word line WL.

Next, in the memory cell region 1, the n-type impurity is implanted into the p-well 12a in both sides of the gate electrodes 13a, 13b to form the n-type impurity diffused region 15a, which will become the source/drain of the n-channel MOS transistor. It is also possible to form the n-type impurity diffused region into the p-well (not illustrated) of the peripheral circuit region 2. Accordingly, in the peripheral circuit region 2, the p-type impurity ion is implanted to the n-well 12b in both sides of the gate electrode 13c to form the n-type impurity diffused region 15b which will become the source/drain of the p-channel MOS transistor. The resist pattern separates the implantation of the n-type impurity and the p-type impurity.

After forming an insulating film to the entire surface of the silicon substrate 10, the insulating film is etched back leaving the sidewall insulating film 16 on both sides of the gate electrodes 13a to 13c and the wiring 14. As mentioned above, the silicon oxide film ($SiO_2$ film) is formed, for example, with the CVD method.

Next, a silicon oxide-nitride (S/ON) film is formed with a thickness of about 200 nm to the entire surface of the silicon substrate 10 as a cover film 3 with the plasma CVD method. Thereafter, the $SiO_2$ film is formed on the cover film 3 with a thickness of about 1.0 μm using the plasma CVD method and TEOS gas, thereby forming a first interlayer insulating film 17. The $SiO_2$ film formed with the plasma CVD method using TEOS gas is also called a P-TEOS film.

Subsequently, heat treatment is performed on the first interlayer insulating film 17 at a temperature of about 700° C. for 30 minutes in a nitrogen atmosphere under normal pressure for densifying the first interlayer insulating film 17. Thereafter, the first interlayer insulating film 17 is polished with a CMP (Chemical Mechanical Polishing) method to flatten the upper surface of the first interlayer insulating film 17.

Figure 2:
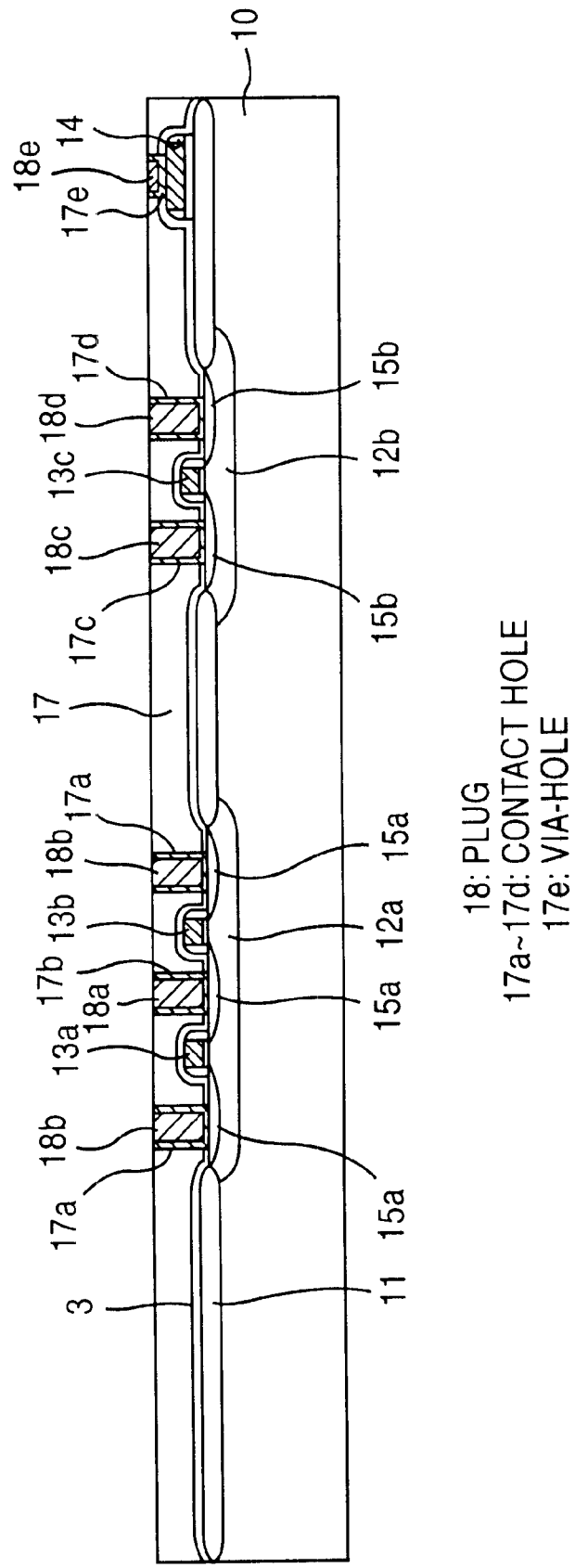

Next, the processes to form the structure illustrated in FIG. 2 will be explained.

First, contact holes 17a to 17d with sufficient depth to reach the impurity diffused regions 15a, 15b, and via-hole 17e with sufficient depth to reach the wiring 14, are respectively formed on the first interlayer insulating film 17 using the photolithography method. Thereafter, a Ti(titanium) thin film with a thickness of 20 nm and a TiN (titanium nitride) thin film with a thickness of 50 nm, are sequentially formed on the upper surface of the first interlayer insulating film 17 as well as the internal surface of the holes 17a to 17e using the sputtering method. Moreover, tungsten (W) is applied on the TiN thin film with the CVD method. As a result, a tungsten film is embedded within the contact holes 17a to 17d and the via-hole 17e.

Thereafter, the tungsten film along with the TiN thin film and the Ti thin film, are polished with the CMP method until the upper surface of first interlayer insulating film 17 is exposed. After the polishing process, the tungsten film, or the like, remaining within the holes 17a to 17e are used as plugs 18a to 18e for electrically connecting the wiring, explained later, to the impurity diffused regions 15a, 15b and the wiring 14.

The first plug 18a on the n-type impurity diffused region 15a is sandwiched between two gate electrodes 13a, 13b in one p-well 12a of the memory cell region 1. The first plug 18a is connected with the bit line which will be explained later. The remaining two plugs 18b are connected to the capacitor which will also be explained later.

Similarly, it is also possible that after forming the contact holes 17a to 17b and the via-hole 17e, impurity ion may be implanted in the impurity diffused regions 15a, 15b to compensate for the contact.

Figure 3:
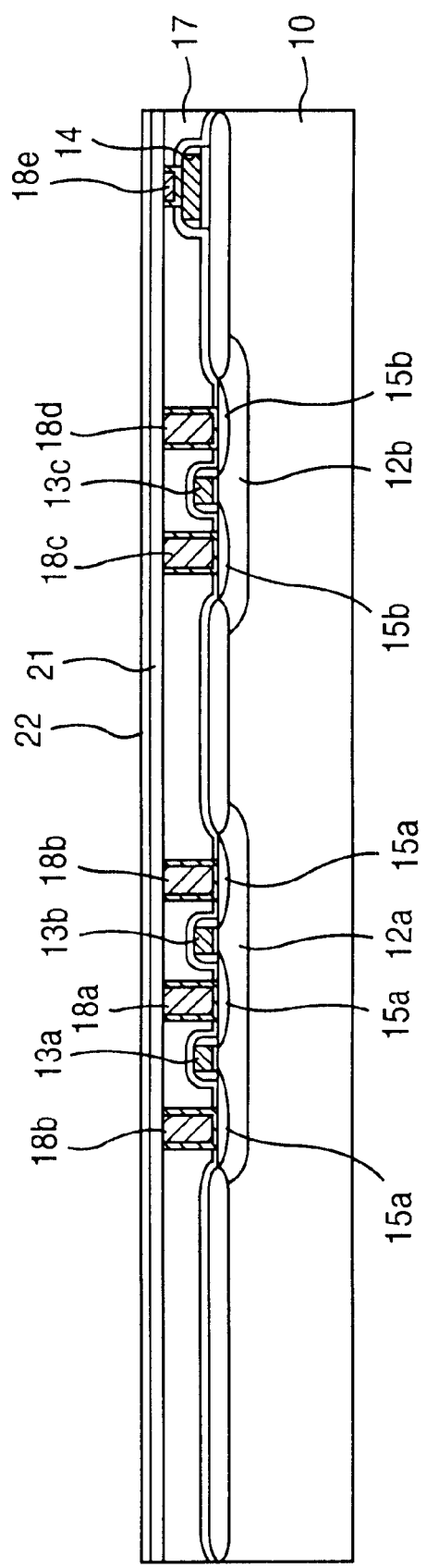

Referring to FIG. 3, in order to prevent oxidation of the plugs 18a to 18e, an SiON film (insulating film) 21 is formed, with a thickness of 100 nm, on the first interlayer insulating film 17 and plugs 18a to 18e using silane ($SiH_4$) with the plasma enhanced CVD method. Moreover an $SiO_2$ film is formed with a thickness of 130 nm using TEOS and oxygen as a reaction gas with the plasma enhanced CVD method. This SiON film 21 is formed to prevent the penetration of moisture into the first interlayer insulating film 17.

These films are then thermally processed for 30 minutes at the temperature of 650° C. in nitrogen atmosphere under normal pressure for condensing the SiON film 21 and the $SiO_2$ film 22 in order to densify the SiON film 21 and the $SiO_2$ film 22.

Here, the first interlayer insulating film 17 and the $SiO_2$ film 22 formed using the TEOS gas with the plasma enhanced CVD method are respectively heated up to the temperature of 650° C. to 700° C., but since the aluminum like metal film having a low melting point does not exist under these films, any adverse effect due to the heat treatment is not generated.

Figure 4:
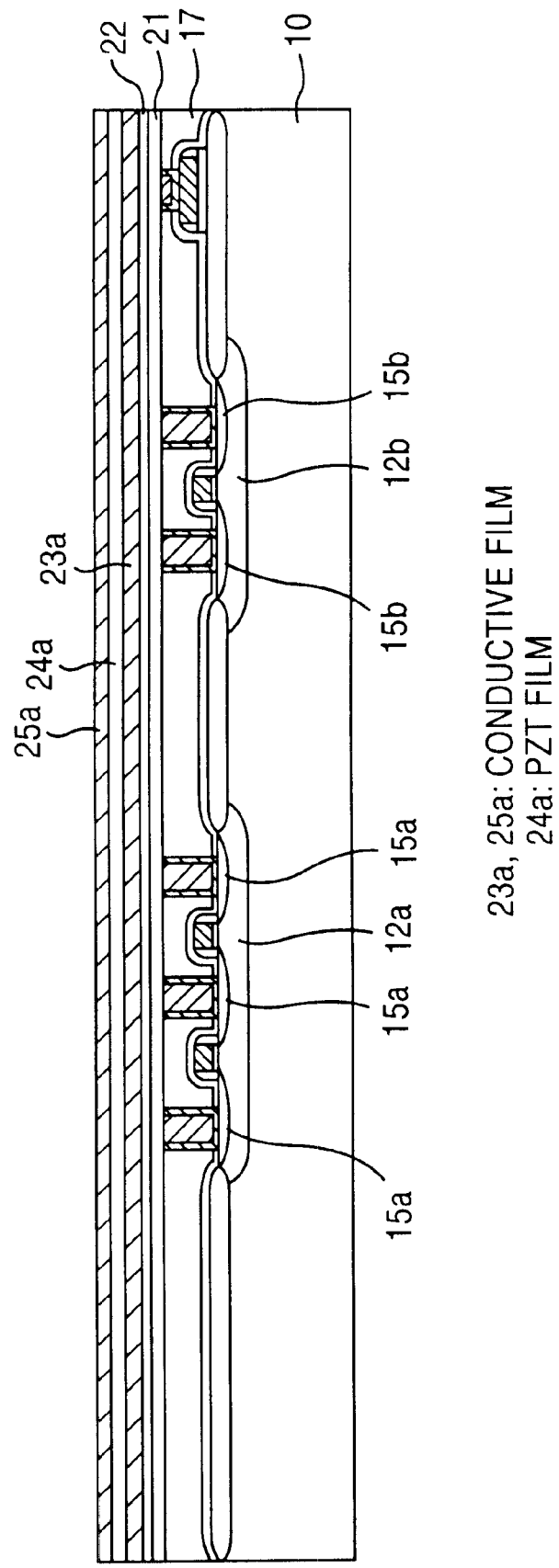

Referring to FIG. 4, Ti and Pt (Platinum) are sequentially deposited on the $SiO_2$ film 22 using the DC (Direct Current) sputtering method to form a first conductive film 23a of a double-layer structure. In this case. The Ti film is formed with a thickness of about 10 to 30 nm, while the Pt film is formed with a thickness of about 100 to 300 nm. For example, the Ti film may be formed with a thickness of 20 nm and the Pt film may be formed with a thickness of 175 nm. Accordingly, a film comprising iridium, ruthenium, ruthenium oxide, iridium oxide ($IrO_2$) strontium ruthenium oxide ($SrRuO_3$: SRO) may be formed as the first conductive film 23a.

Subsequently, a PZT film 24a is formed by depositing the lead zirconate titanate (PZT: $Pb(Zr_{1-x}Ti_x)O_3$) which is a ferroelectric material, on the first conductive film 23a. The PZT film 24a is deposited with a thickness of 100 to 300 nm using the RF (Radio Frequency) sputtering method. For example, the thickness of the PZT film 24a may be set to 200 nm.

The RTA (Rapid Thermal Annealing) is conducted for 30 to 120 seconds in the oxygen atmosphere under the temperature condition of 650 to 850° C. for the crystallization process of the PZT film 24a. For example, the annealing may be conducted at the temperature of 750° C. for 60 seconds.

In addition to the above sputtering methods, the spin-on method, the sol-gel method, and the MOD (Metal Organic Deposition) method, the MOCVD method are provided as other methods of forming the ferroelectric film. Moreover, lead lanthanum zirconate titanate (PLZT), $SrBi_2(Ta_xNb_{1-x})_2O_9$ (where, 0<x<1), $Bi_4Ti_2O_{12}$ or the like, are also provided as ferroelectric materials, in addition to PZT. Moreover, in the case of forming DRAM, it is enough to use a ferroelectric material such as $(BaS)TiO_3$ (BST), strontium titanate (STO) or the like in place of the above ferroelectric material.

After forming the PZT film 24a, a Pt film is formed as a second conductive film 25a on the PZT film 24a with a thickness of 100 to 300 nm using the DC sputtering method. For example, the second conductive film 25a may be formed with a thickness of 200 nm. Here, it is also possible to form an $IrO_2$ film or an SRO film as the second conductive film 25a using the sputtering method.

Figure 5:
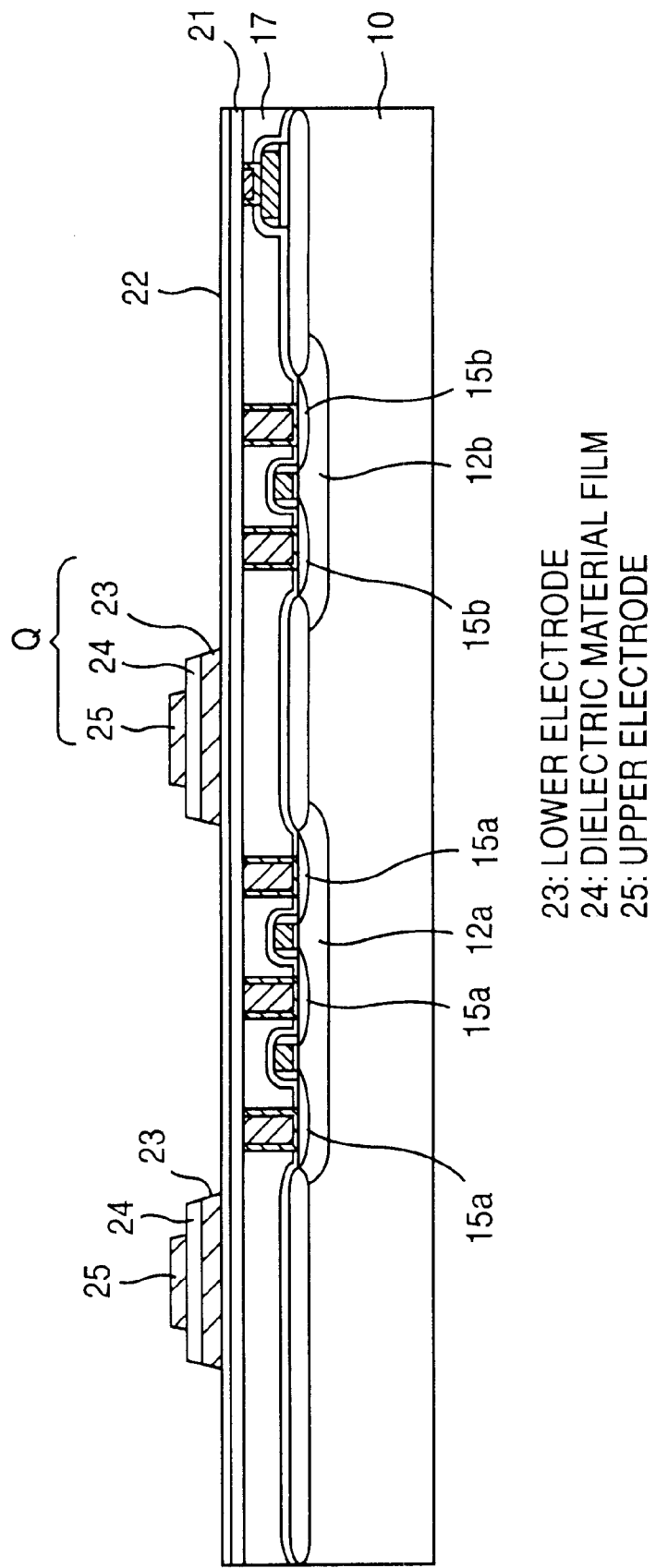

Next, the second conductive film 25a, the PZT film 24a and the first conductive film 23a are sequentially patterned using the photolithography method morder to form a capacitor Q of a predetermined shape as illustrated in FIG. 5.

After the patterning, the second conductive film 25a becomes an upper electrode 25, the PZT film 24a becomes a dielectric film 24 and the first conductive film 23a becomes a lower electrode 23. The capacitor Q is structured with the upper electrode 25, the dielectric film 24 and the lower electrode 23. The capacitor Q is formed at the periphery of the p-well 12a as many as the number of MOS transistors formed within one p-well 12a.

Here, after formation of the upper electrode 25 by patterning the second conductive film 25a, the recovery annealing is conducted to eliminate damage of the capacitor Q. In practice, the capacitor Q is heated for 30 to 120 minutes at the temperature of 500 to 700° C. on the silicon substrate 10 under the oxygen atmosphere. For example, the recovery annealing may be conducted for heat treatment of 60 minutes under the temperature of 650° C. Moreover, the recovery annealing may also be conducted under the same condition even after forming the lower electrode 23 by patterning the first conductive film 23a.

Figure 6:
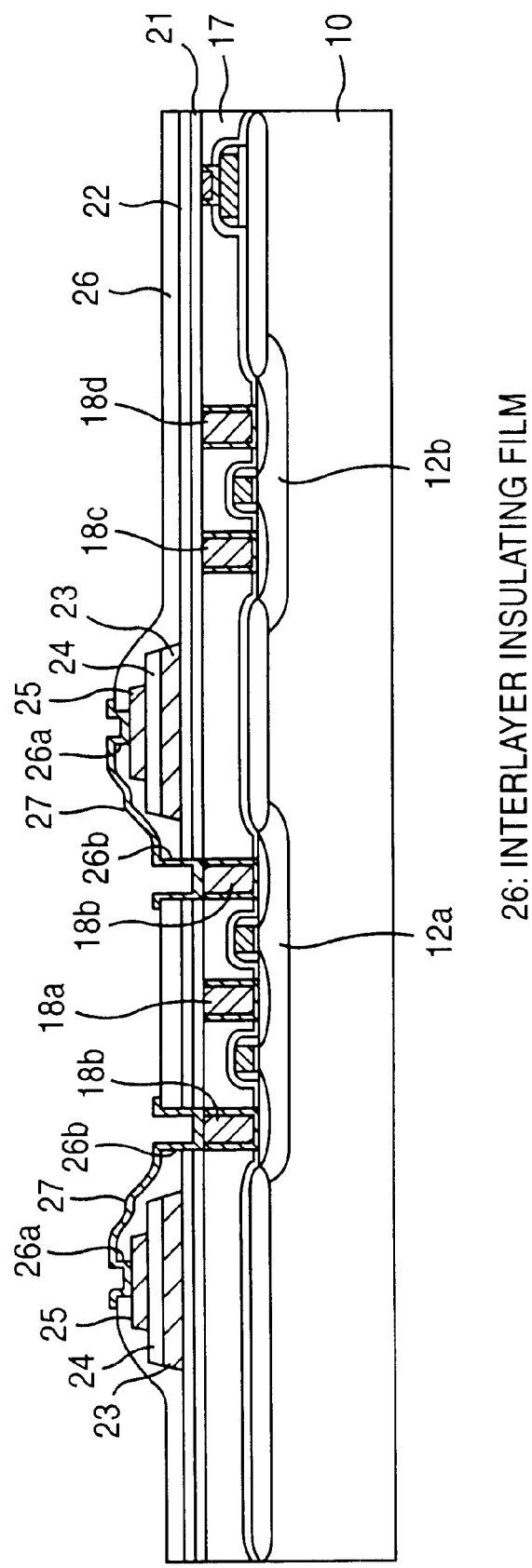

Referring to FIG. 6, after forming the capacitor Q through the processes explained above, a second interlayer insulating film 26 of a double-layer structure consisting of a P-TEOS film and a SOG (Spin-On-Glass) film is formed on the entire surface. This second interlayer insulating film 26 covers the capacitor Q.

The P-TEOS film is formed with a thickness of 100 to 300 nm on the entire upper surface of the silicon substrate 10 using the plasma enhanced CVD method with TEOS gas under the condition that the growth temperature is 390° C. and power is 400W. The SOG film is formed after coating the P-TEOS film with an SOG solution with a thickness of 80 to 200 nm. The coating is then heated. For example, the P-TEOS film may be set with a thickness of 200 nm, while the SOG film may be set with a thickness of 100 nm. Since the SOG film is a coating insulating film, level differences between the projection and recess become small. The SOG film may be removed using the etching back method. In this case, the P-TEOS film may be set with a thickness of 500 nm, while the SOG film may be set with a thickness of 100 nm.

The second inter layer insulating film 26 is patterned using the photolithography method to form a contact hole 26a on the upper electrode 25 of capacitor Q. Thereafter, the recovery anneal is conducted to the dielectric film 24. In practice, the dielectric film 24 is heated for 30 to 120 minutes at the temperature of 500 to 650° C. under the oxygen atmosphere. In this example, heat treatment is conducted for 60 minutes at the temperature of 550° C.

Next, the second interlayer insulating film 26, the SiON film 21, the $SiO_2$ film 22 are patterned using the photolithography method to form a contact hole 26b on the second plug 18b of the memory cell region 1 in order to expose the second plug 18b. Thereafter, a TiN film is formed with a thickness of 100 nm using the sputtering method on the second interlayer insulating film 26 and within the contact holes 26a, 26b.

Subsequently, the TiN film is patterned using the photolithography method to form a local interconnection 27 to electrically connect the second plug 18b and the upper electrode 25 through the contact holes 26a, 26b in the memory cell region 1.

Figure 7:
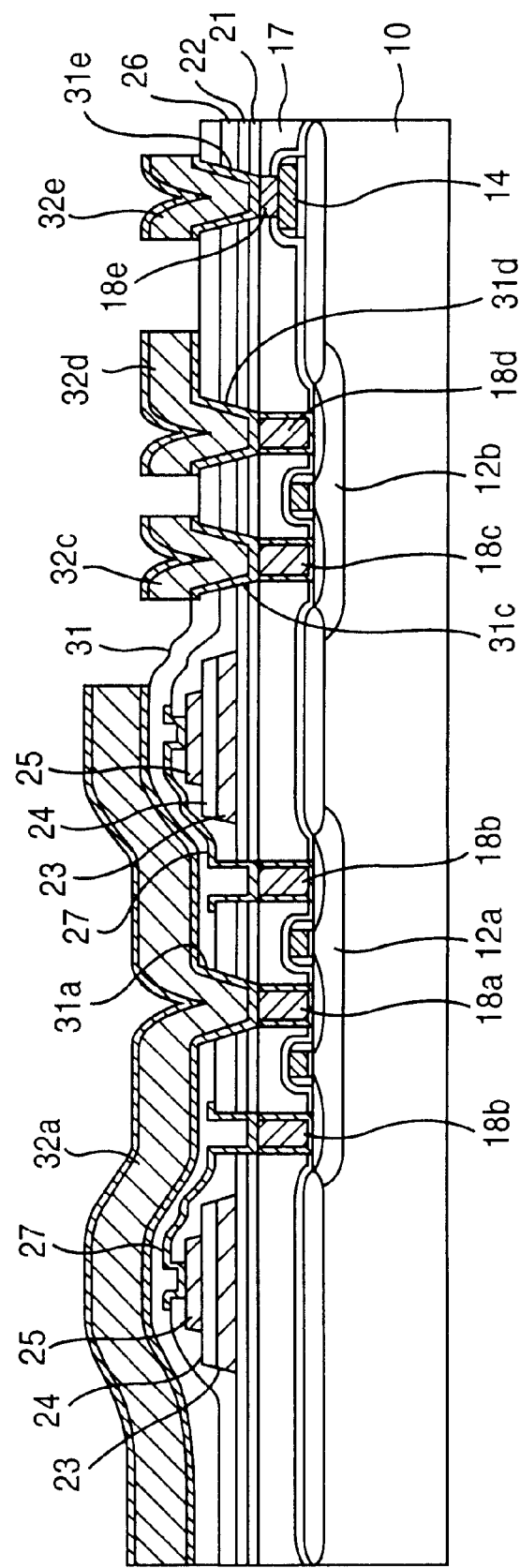

Next, the processes to form the structure as illustrated in FIG. 7 will be explained below.

First, a P-TEOS film is formed in the thickness of 200 to 400 nm on the local interconnection 27 and the second interlayer insulating film 26. As an example, a thickness of 30 nm may be used. The P-TEOS film is used as a third interlayer insulating film 31. Level differences of projection and recess at the upper surface of the third interlayer insulating film is not so large as to require the polishing process.

A contact hole 31a is then formed on the first plug 18a with contact holes 31c to 31e also formed on each plug 18c to 18e of the peripheral circuit region 2 using the photolithography method patterning. The region is from the third interlayer insulating film 31 of the memory cell region 1 to the lower SiON film 21 under such memory cell region 1.

By way of example, five layers consisting of: a Ti film with a thickness of 20 nm; a TiN film with a thickness of 50 nm; an Al(aluminum) film with a thickness of 600 nm; a TiN film with a thickness of 5 nm; and a TiN film with a thickness of 150 nm are sequentially laminated on the third interlayer insulating film 31 and within the contact holes 31c to 31e. These metal films are patterned to form a bit line 32a, in the memory cell region 1, and wirings 32c to 32e in the peripheral circuit region 2. These bit line 32a and wirings 32c to 32e become the aluminum wirings on the first layer.

Here, the bit line 32a of the memory cell region 1 is connected to the first plug 18a and the wirings 32c to 32e of the peripheral circuit region 2 are connected to each plug 18c to 18e.

Figure 8:
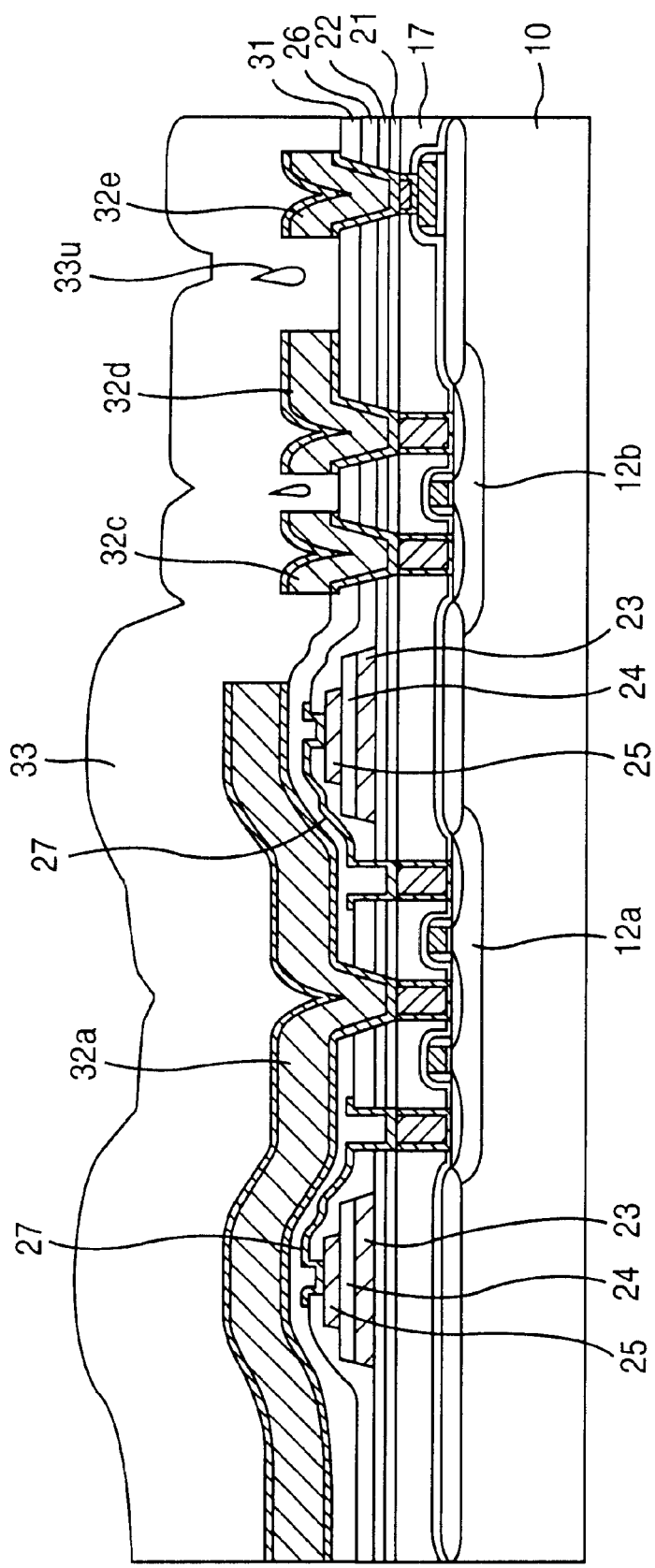

Referring now to FIG. 8, a fourth interlayer insulating film 33 consisting of $SiO_2$ with a thickness of 2.0μm is formed on the third interlayer insulating film 31, the bit line 32a, and the wirings 32c to 32e using the plasma enhanced CVD method with TEOS gas and oxygen gas ($O_2$).

The apparatus used to implement the plasma CVD method comprises a chamber including: a first electrode to load the silicon substrate 10, and a second electrode provided opposite thereto; and a single frequency application structure for impressing a high frequency power to the second electrode and impressing a constant voltage to the first electrode.

In this case, the growth temperature is set to 400° C. or less. (For example, to 390° C.), and the pressure is set to 1.2 Pa for the film forming conditions. Moreover, the high frequency power is set to 13.56 MHz and its power is set to 200W. A flow rate of oxygen for the TEOS gas is set, for example, to about 1. According to these conditions, the ferroelectric material forming the capacitor Q during the film formation will not substantially deteriorate and will not provide an adverse effect on the bit line 32a and the wirings 32c to 32e.

Since the fourth interlayer insulating film 33 formed using the plasma enhanced CVD method with TEOS gas and oxygen gas grows isotropically, the shape of the fourth interlayer insulating film's 33 upper surface is easily influenced by the shape of the first layer's aluminum wiring such as the bit line 32a and the wirings 32c to 32e. Accordingly, when an attempt to form the aluminum wiring as the second layer on the P-TEOS film as the fourth interlayer insulating film 33, a problem arises because the patterning accuracy of the aluminum wiring of the second layer is lowered and the wiring may break easily.

Figure 9:
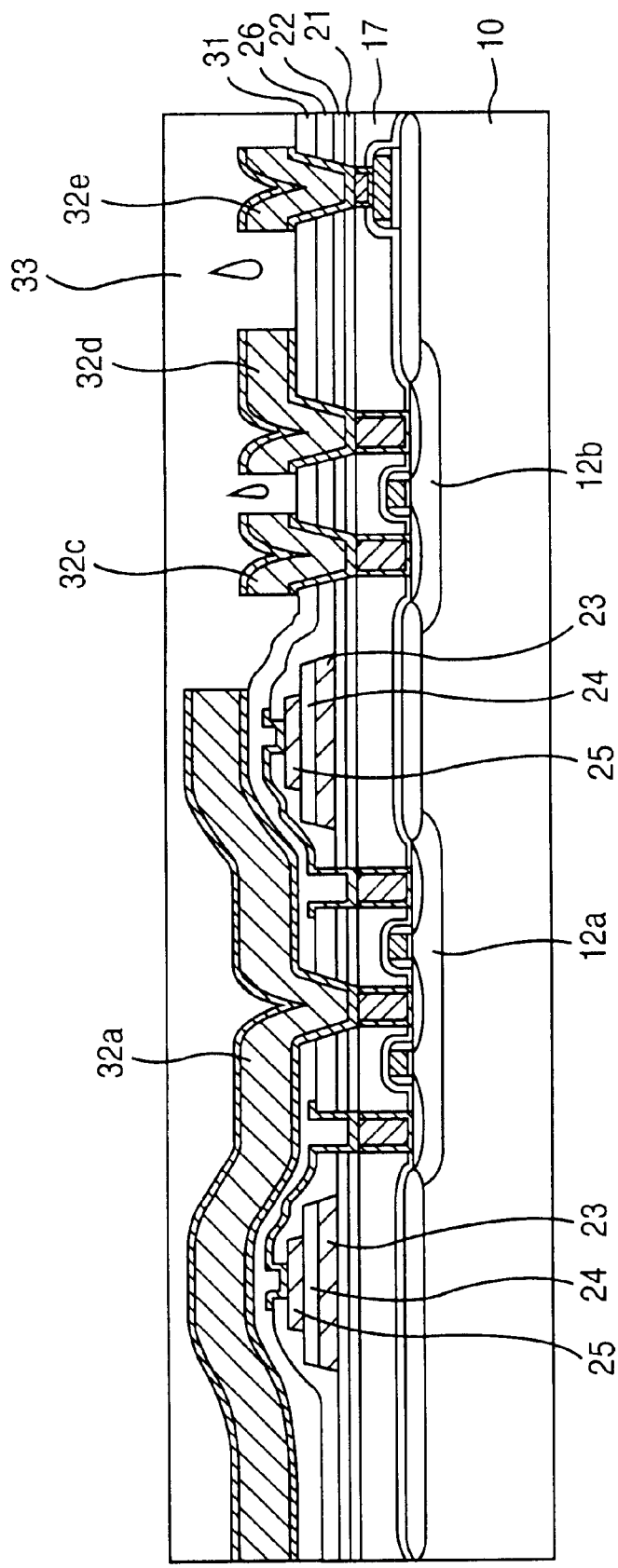

Referring to FIG. 9, the process of polishing the upper surface using the CMP method is introduced as a method of flattening the upper surface of the P-TEOS film as the fourth interlayer insulating film 33. The polishing amount is about 1.0 μm of thickness from the upper most surface.

Here, it has been proven by experiment that when the fourth interlayer insulating film 33 is heated, as will be explained later, after the fourth interlayer insulating film 33 is polished using the CMP method, the polarization charges of the capacitor Q is reduced by such heating process.

The reason for such phenomenon may be attributed to the moisture of slurry used for flattening the surface by the CMP method, and the cleaning solvent used for the subsequent cleaning process being adhered to the surface of the P-TEOS film as the fourth interlayer insulting film 33, or being absorbed into the internal side thereof, and reaching the capacitor Q at the lower side of such P-TEOS film. Thus, such moisture deteriorates the capacitor Q through the heat treatment.

Namely, when the capacitor Q is heated up to a high temperature after the polishing of the fourth interlayer insulating film 33, the ferroelectric material forming the capacitor dielectric material film 24 is reduced by the moisture of the interlayer insulating film. The ferroelectric material loses the ferroelectricity or the interface between the ferroelectric material. Thus, the electrode deteriorates due to the moisture. Particularly, when the fourth interlayer insulating film 33 and the third interlayer insulating film 31 are heated under the condition in which the fourth interlayer insulating film 33 is covered with the metal film as described later, the moisture absorbed in the fourth interlayer insulating film 33 is not easily released to the external side, and therefore, the moisture penetrates into the third interlayer insulating film 31 passing through the gap against the bit wiring 32a. The moisture then reaches the periphery of the capacitor Q which causes accelerated deterioration of the capacitor Q.

Figure 10:
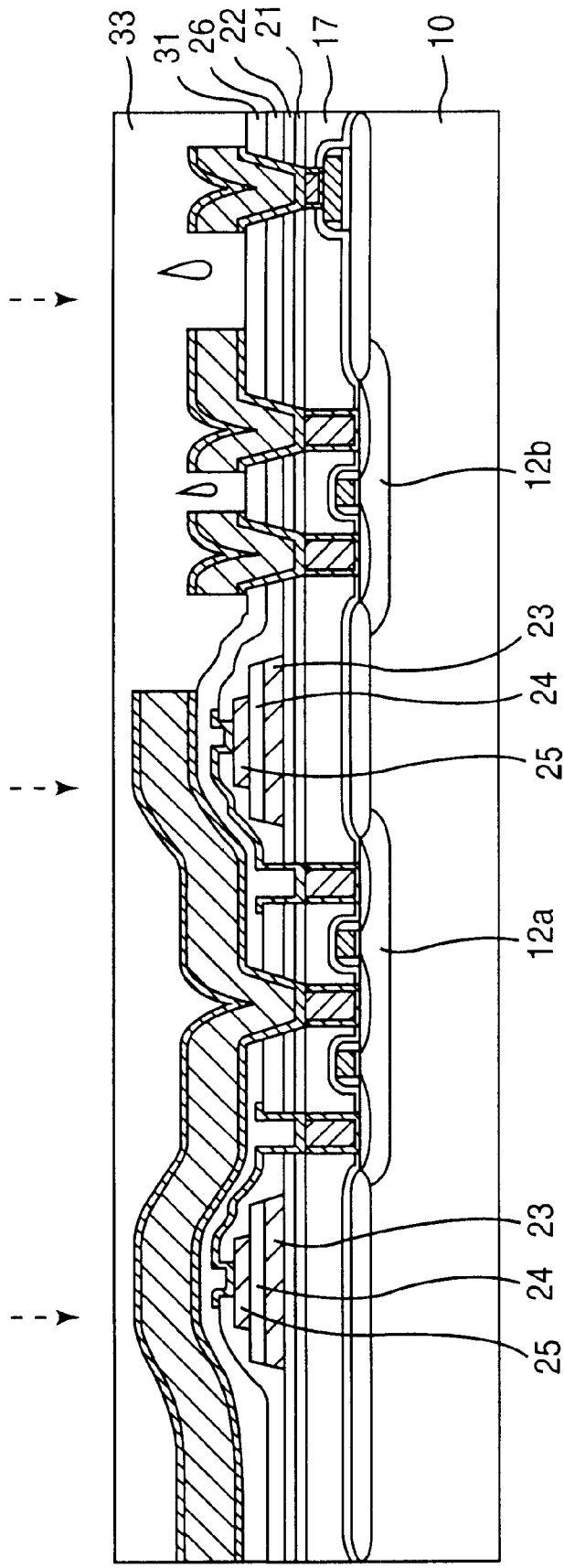

Therefore, referring to FIG. 10, in order to prevent deterioration of the capacitor Q, a dehydration process by the plasma annealing is performed on the fourth interlayer insulating film 33 thus eliminating the moisture entered into the fourth interlayer insulating film 33 during the polishing process and the moisture adhered to the surface thereof.

Namely, after the fourth interlayer insulating film 33 is flattened using the CMP method, the silicon substrate 10 is placed within the chamber of the plasma generating apparatus (not illustrated). $N_2O$ gas and $N_2$ gas are respectively supplied in the flow rate of 700 sccm ($N_2O$) and 200 sccm ($N_2$) within the chamber. These gases are converted to the plasma and the substrate temperature is set to 450° C. or less, for example, to 350° C. The fourth interlayer insulating film 33 is then exposed to the plasma for 3 minutes or longer, preferably for 4 minutes or longer. Thereby, the moisture within the fourth interlayer insulating film 33 is release to the external side., and nitrogen (N) atomsenter at least the surface of the fourth interlayer insulating film 33 forming SiON. Accordingly, the moisture cannot easily enter the fourth interlayer insulting film thereafter.

When it is necessary to form the nitride film of the plasma TEOS film using N atom rather then using plasma heat treatment at 1000° C. or higher is required since the $N_2$ molecules used are inactive. Moreover, even when the more active ammonium ($NH_3$) molecules are used, the heat-treatment at 750° C. or higher is required. This causes a problem since the aluminum wiring layer as the lower layer is fused. The plasma annealing is most effective for efficient nitriding of the P-TEOS film.

When plasma annealing is performed at the temperature of 450° C. or less, it does not give any influence on the aluminum wirings 32a, 32c to 32e of the first layer formed of aluminum at the lower side.

According to the way, the Japanese Published Patent Application No. HEI 10-83990 (U.S. Pat. No. 6,017,784), hydrogen in the silicon oxide film is degasificated with $N_2$ or with the plasma process of $N_2O$ after forming the silicon oxide film using the TEOS gas. This plasma process not conducted for the polished silicon oxide film and moreover for the silicon oxide film covering the ferroelectric capacitor.

However, in the present embodiment, the plasma annealing is performed on the fourth interlayer insulating film 33 after the surface consisting of SiO$_2$ is formed using the P-TEOS. The above US patent does not describe as prior art that the N$_2$O plasma annealing is effective for eliminating the moisture entering in the polishing process. Moreover, in this embodiment, it is proven that excellent characteristic of the ferroelectric material or high dielectric capacitor Q can be maintained through the plasma annealing under the conditions explained above.

Figure 11:
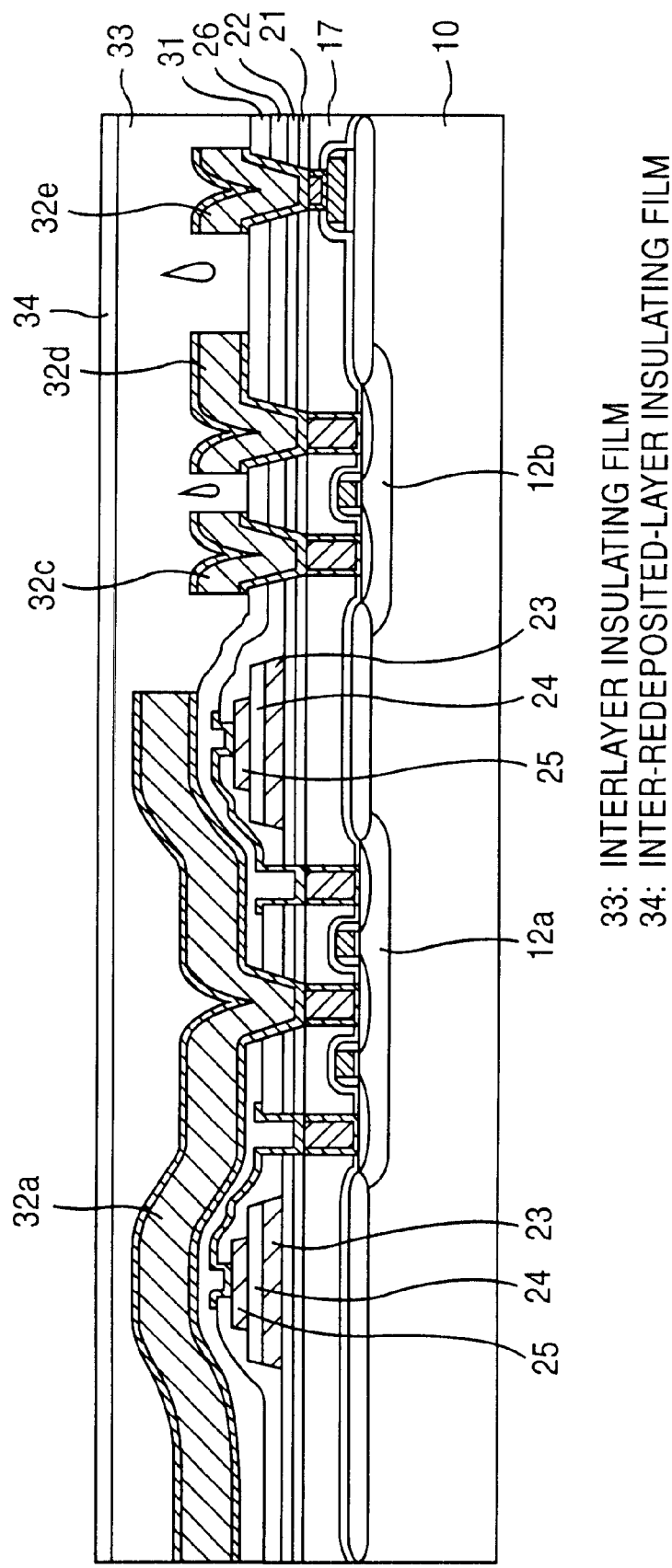

Referring to FIG. 11, a TEOS film is formed as an inter-redeposited-layer insulating film 34 on the interlayer insulating film 33 with a thickness of 100 nm or more after completion of the plasma annealing process explained above. An example, would be a thickness of 200 nm. The inter-redeposited-layer insulating film 34 is formed to cover the cavity appearing on the polished surface of the fourth interlayer insulating film 33 as will be explained next. The inter-redeposited-layer insulating film 34 works as a cap layer to prevent re-humidity-absorption of the interlayer insulating film 33. The optimum thickness of the inter-redeposited-layer insulating film 34 will be explained later. Here, it is also possible to conduct the N$_2$O plasma annealing to the inter-redeposited-layer insulating film 34.

As explained above, cavity called keyholes or slits (also called blowholes or voids) appears sometimes at the polishing surface of the fourth interlayer insulating film 33. The reason for the cavity appearing is explained below.

When the TEOS film is formed using the CVD method, the P-TEOS film grows isotropically. When the thickness becomes about 2.0 $\mu$m, the cavity may easily be generated between the aluminum wirings of the first layer, namely between the bit lines of the memory cell region 1 and between the aluminum wirings 32c to 32e of the first layer of the peripheral circuit region 2.

Moreover, since the bit line 32a is lifted with the capacitor Q, the cavity 33u generated between the bit lines 32a is formed at a position higher than that of the cavity 33u generated at other regions.

Therefore, after the fourth interlayer insulating film 33 consisting of a TEOS layer is polished, the cavity 33u existing in the memory cell region 1 is easily exposed from the polished surface.

As explained above, the cavity 33u is exposed from the fourth interlayer insulating film 33 in the memory cell 1 ike a groove along the bit lines 32a. When the a metal film is formed directly on the fourth interlayer insulting film 33 to form the wiring, with exposed cavity 33u, such metal film is embedded within the cavity 33u. Even if after the wiring is formed by patterning the metal film, the metal film in the cavity 33u is not removed and is left therein. Since the metal film in the cavity 33u becomes a means to short-circuit the wirings formed of the same metal film, it is necessary to form the metal film before it is formed within the cavity 33u.

Referring to FIG. 11, in the present embodiment, the polished surface of the fourth interlayer insulating film 33 is covered with the inter-redeposited-layer insulating film 34 after the fourth interlayer insulating film 33 is polished. This prevents the metal film from forming within the exposed cavity 33u on the polished surface of the fourth interlayer insulating film 34.

After forming the inter-redeposited-layer insulating film 34, the aluminum wiring of the second layer is formed according to the processes illustrated in FIG. 12 to FIG. 16.

Figure 12:
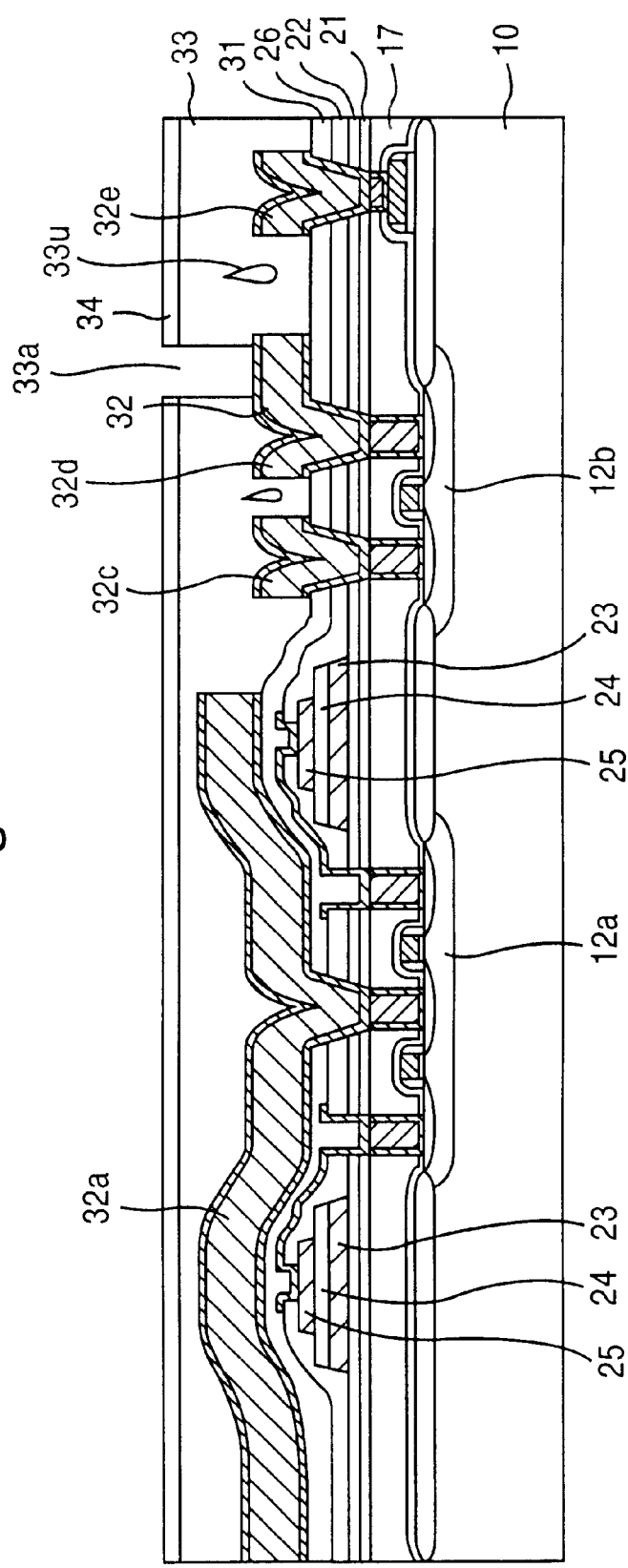

First, referring to FIG. 12, the inter-redeposited-layer insulating film 34 and the fourth interlayer insulating film 33 are patterned using the photolithography method to form a via-hole 33a to reach the aluminum wiring of the first layer.

Thereafter, the surface of the wiring 32d under the via-hole 33a is etched for a predetermined amount. An example may be a depth of 35 nm.

Figure 13:
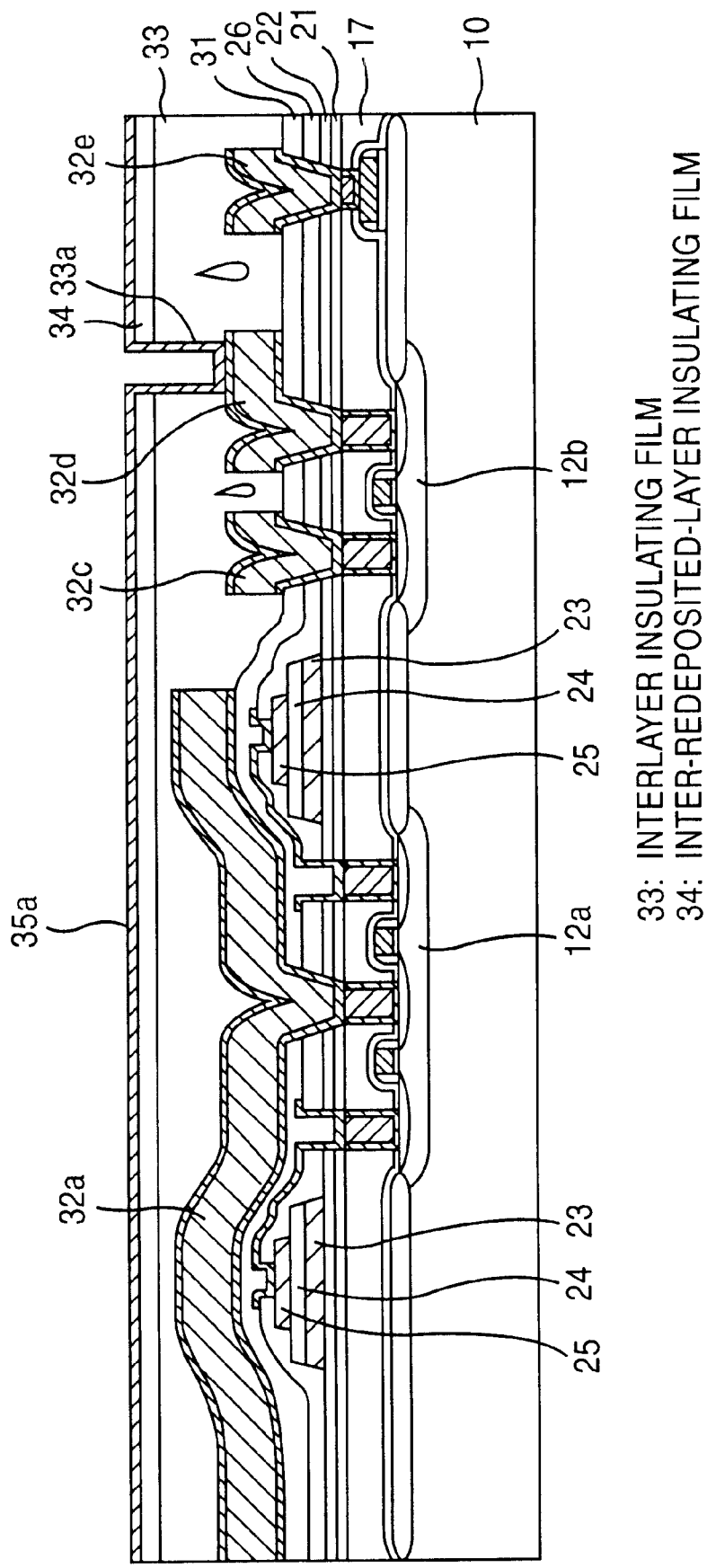

Referring to FIG. 13, a Ti film with a thickness of 20 nm and a TiN film with a thickness of 50 nm are sequentially formed using the sputtering method at the internal surface of the via-hole 33a and on the upper surface of the inter-redeposited-layer insulating film 34. These layers are called glue layer 35a.

Figure 14:
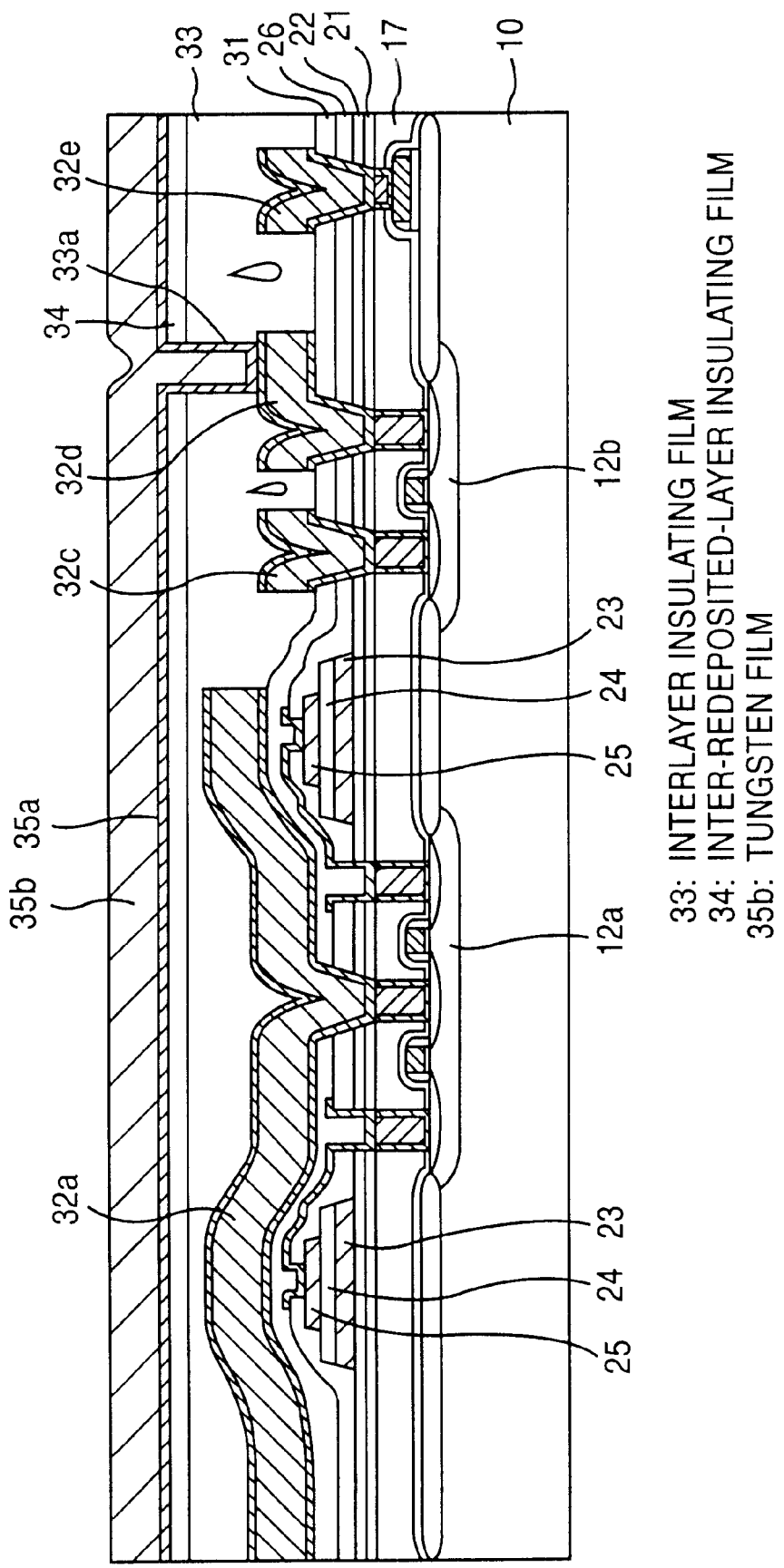

Thereafter, a tungsten seed (not illustrated) is formed on the glue layer 35 using the CVD method with tungsten hexafluoride (WF$_6$) gas, silane (SiH$_4$) gas and hydrogen (H$_2$) gas. In addition, a tungsten film 35b is formed on the glue layer 35a by adding the H$_2$ gas to the WF$_6$ gas at the growth temperature of 430° C. Thus, as illustrated in FIG. 14, the via-hole 33a is filled with the glue layer 35a and the tungsten layer 35b.

Figure 15:
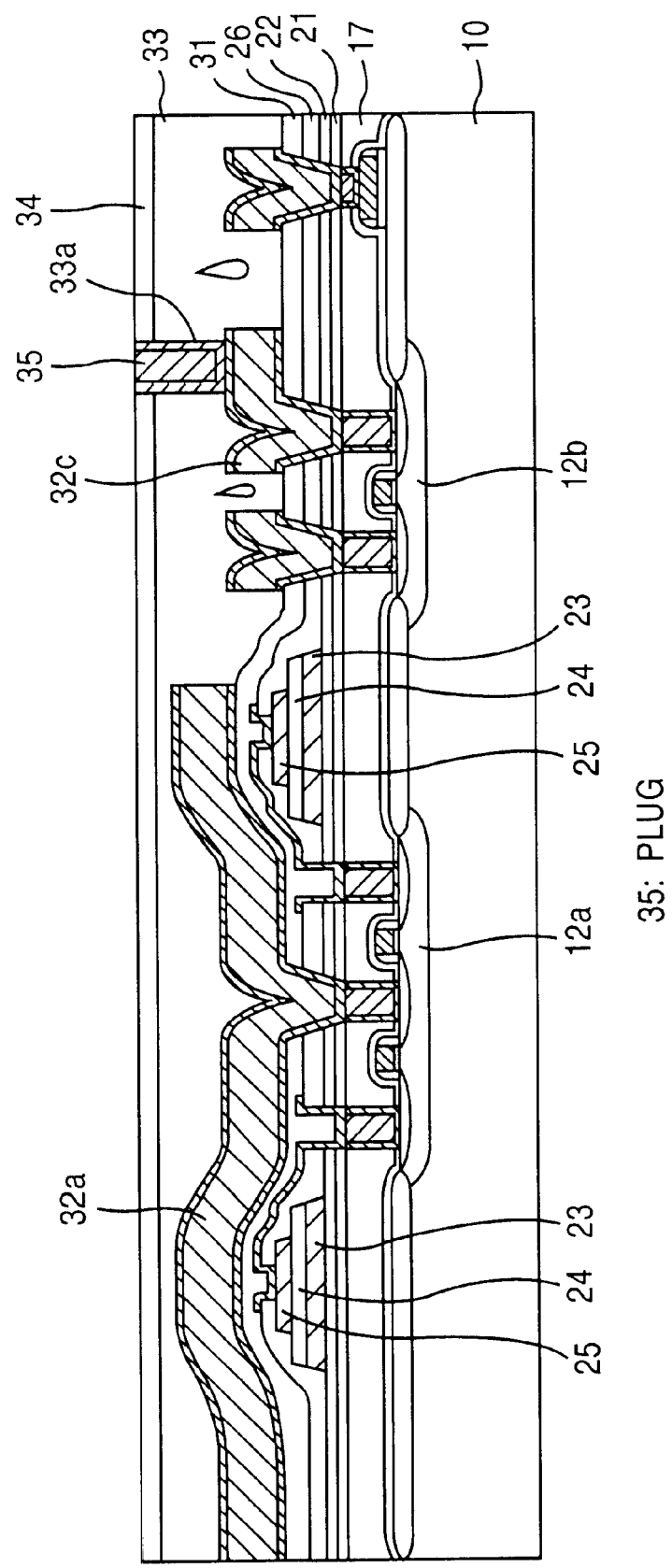

The tungsten film 35b at the upper surface of the inter-redeposited-layer insulating film 34 is then removed using the CMP method or the etch-back method to leave only the other film within the via-hole 33a. In this case, the glue layer 35a on the inter-deposited-layer insulating film 34 may be left or removed. In FIG. 15, the glue layer 35a is removed from the upper surface of the inter-deposited-layer insulating film 34 using the CMP method. Accordingly, the via plug 35 for electrically connecting the wiring 32d and upper layer wiring is formed within the via-hole 33a.

Incidentally, the width of the cavity 33u on the polished surface of the fourth interlayer insulating film 33 is not uniform due to fluctuation of polishing process using the CMP method. When the width of the cavity 33u fluctuates, the following problem occurs.

Namely, when a thin inter-redeposited-layer insulating film 34 is formed on the cavity 33u exposed from the fourth interlayer insulating film 33, the cavity 33u is not perfectly covered with the inter-redeposited-layer insulating film 34. Therefore, a part of the cavity is exposed. When the glue layer 35a is formed under the condition explained above, the glue layer 35a will probably cause breakage at the stepped portion of the cavity 33u forming a slit. If such slit exists, hydrogen in the reaction gas, used at the time of forming the tungsten film 35b, enters the lower fourth interlayer insulating film 33 through the slit. Hydrogen entering the fourth interlayer insulating film 33 is not preferred because it will deteriorate the capacitor characteristic.

Therefore, in order to surely cover the cavity 33u exposed from the fourth interlayer insulating film 33, the inter-deposited-layer insulating film 34 is required to have the thickness of 300 nm or more.

Incidentally, the thickness required for the inter-redeposited-layer insulating film 34 to prevent the cavity 33u from filling up with the glue layer 35a and the tungsten film 35b has been investigated. Also, it has been proven that the wirings frequently leak when the thickness of the inter-redeposited-layer insulating film 34 is 50 nm. When the thickness is increased, leakage between the wirings is reduced and the wiring-to-wiring short circuit can be prevented when such thickness is set to 100 nm. Therefore, it is desirable to reduce the lead between wirings and have a inter-redeposited-layer insulating film 34 that is at least 100 nm thick.

In addition, investigation has been conducted on the relationship between film thickness of the inter-redeposited-layer insulting film 34 and the change of the capacitor polarization charge amount due to the acceleration test after completing a series of processes. The processes are: formation of the glue layer 35a and the tungsten film 35b on the inter-redeposited-layer insulating film 34; formation of plug 35 by patterning such films; and formation of aluminum wiring of the second layer thereon and coverage on the aluminum wiring of the second layer with the insulating film. Therefore, it has been proven that the polarization charge amount is increased slightly before the acceleration test. However, differences of the polarization charge amount among the samples become distinctive after the heat treatment. In particular, when the inter-redeposited-layer insulating film 34 is not formed, the polarization charge amount is reduced to a half or less after the heat treatment, and the ferroelectric capacitor Q is remarkably deteriorated in its characteristic. Moreover, when the inter-redeposited-layer insulating film 34 is formed with a thickness of 300 nm, deterioration of the ferroelectric capacitor Q is small and the polarization charge amount after the heat treatment becomes 22.6 $\mu C/cm^2$. This is a sufficient value to normally operate the FeRAM.

The inter-redeposited-layer insulating film 34 with a thickness of 300 nm is determined considering the fluctuation of exposure of the cavity 33u.

Here, if the inter-redeposited-layer insulating film 34 is too thick, then an aspect ratio of the via-hole 33 increases and the coverage of the glue layer 35a and the tungsten film 35b in the via-hole 33a becomes worthless. Namely, the upper limit value of the film's thickness of the inter-redeposited-layer insulating film 34 depends on the aspect ratio of the via-hole 33a. For example, when the diameter of via-hole 33a is set 0.6 $\mu$m and thickness of the fourth interlayer insulating film 34 is set to 1.0 $\mu$m, thickness of the inter-redeposited-layer insulting film 34 must be about 0.4 $\mu$m (400 nm) in order to set the aspect ratio of the via-hole 33a to 2.3.

After completing the process to form the inter-redeposited-layer insulating film 34 and the via plug 35 using the process explained above, a first TiN film is formed with a thickness of 50 nm, an Al film is formed with a thickness of 50 nm, and a second TiN film is formed with a thickness of 50 nm sequentially on the inter-redeposited-layer insulating film 34. These films are then patterned to form a wiring 36. On the occasion of leaving the glue layer 35a on the inter-redeposited-layer insulting film 34, formation of the first TiN film is not needed and the Al film and the second TiN film are formed on the glue layer 35a.

Figure 16:
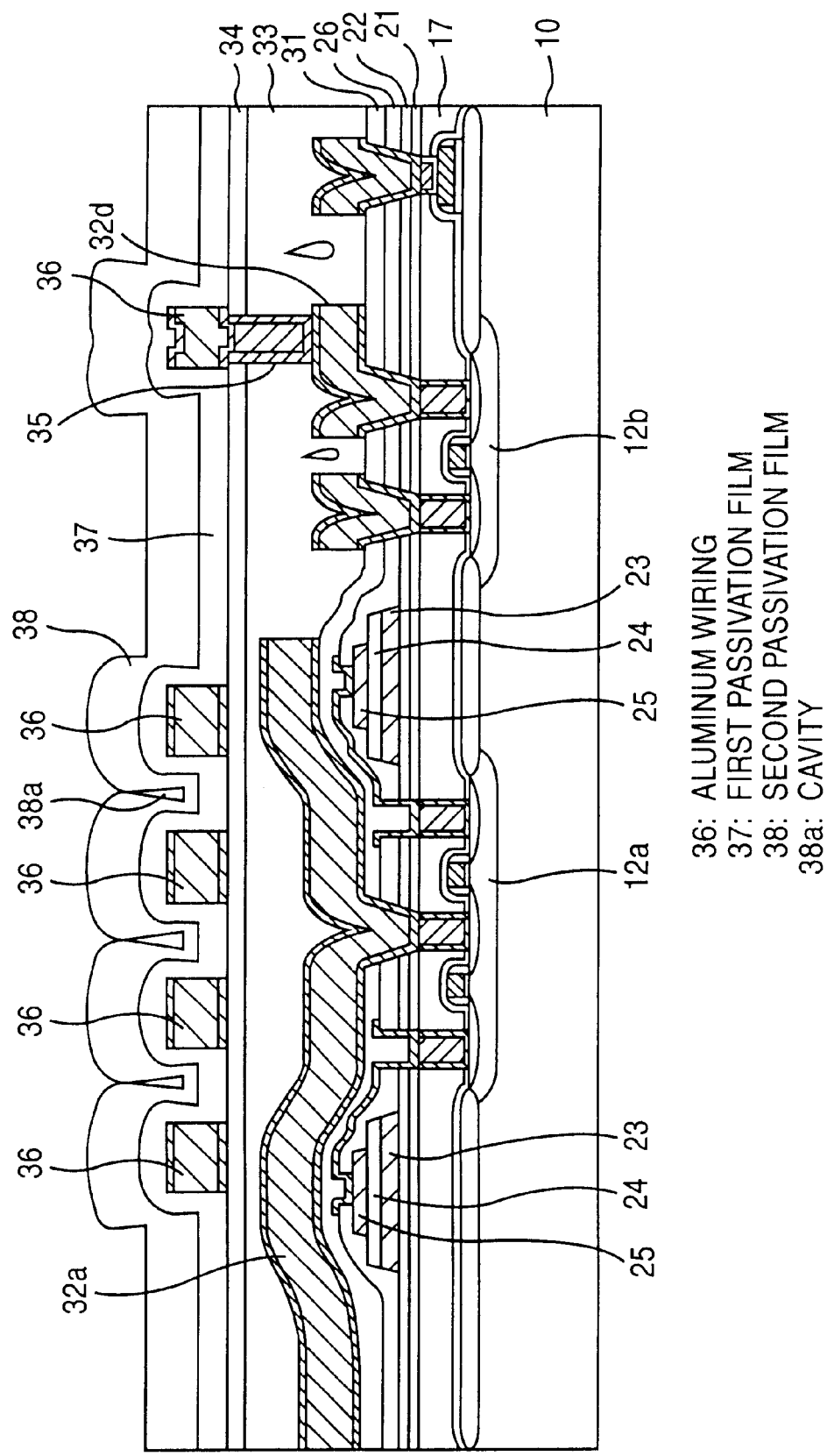

Referring to FIG. 16, the aluminum wiring 36 of the second layer is formed on the inter-redeposited-layer insulating film 34 by patterning the first and second TiN films and the Al film, or the second TiN film, the Al film and the glue layer using the photolithography method.

Thereafter, an $SiO_2$ film is formed with a thickness of 200 nm as a first passivation insulating film 37. The $SiO_2$ film is formed on the aluminum wiring 36 of the second layer, and the inter-redeposited-layer insulting film 34 using the plasma enhanced CVD method with TEOS. In this case, the $N_2O$ plasma annealing is conducted under the same conditions as the $N_2O$ plasma annealing explained above.

Moreover, a second passivation insulating film 38 consisting of SiN is formed, with a thickness of 500 nm using the plasma enhanced CVD method, on the first passivation insulating film 37. In this case, a cavity 40 is formed between the aluminum wirings.

Figure 17:
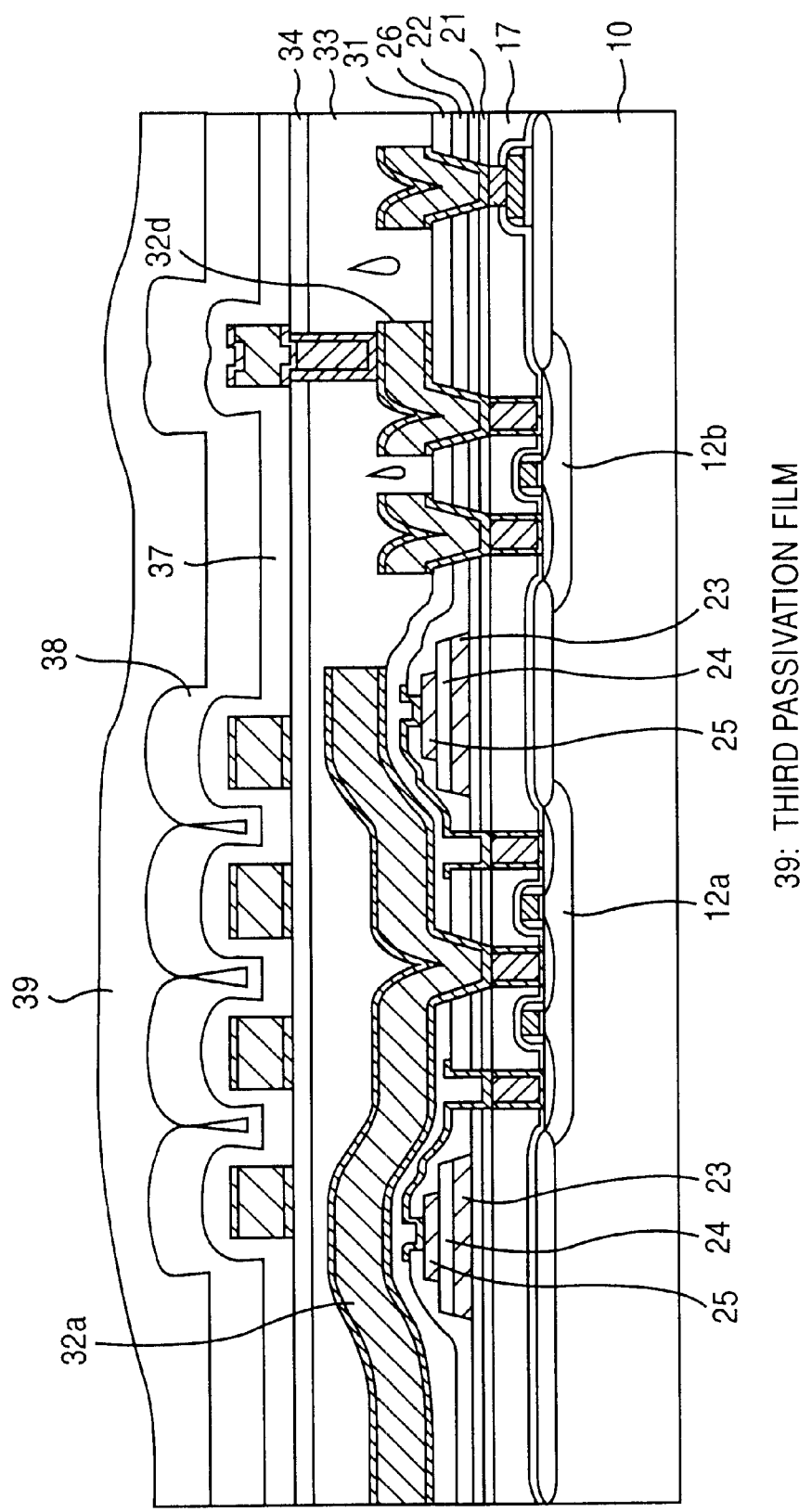

Referring to FIG. 17, a third passivation insulating film 39 consisting of $SiO_2$ is formed, with a thickness of 400 nm using TEOS gas, on the second passivation insulating film 38. For example, the growth condition is set so that growth temperature is 300° C., the TEOS gas is 8.0 slm, an oxygen gas is 37.5 slm, an ozone is 120.0 $g/m^3$. This TEOS-$O_3$ film is superior in flatness, and therefore, the projections and the recesses formed on the surfaces of the first and second passivation films can be flattened. The wiring 36 of the second layer is covered with the first to third passivation films 37 to 39.

Figure 18:
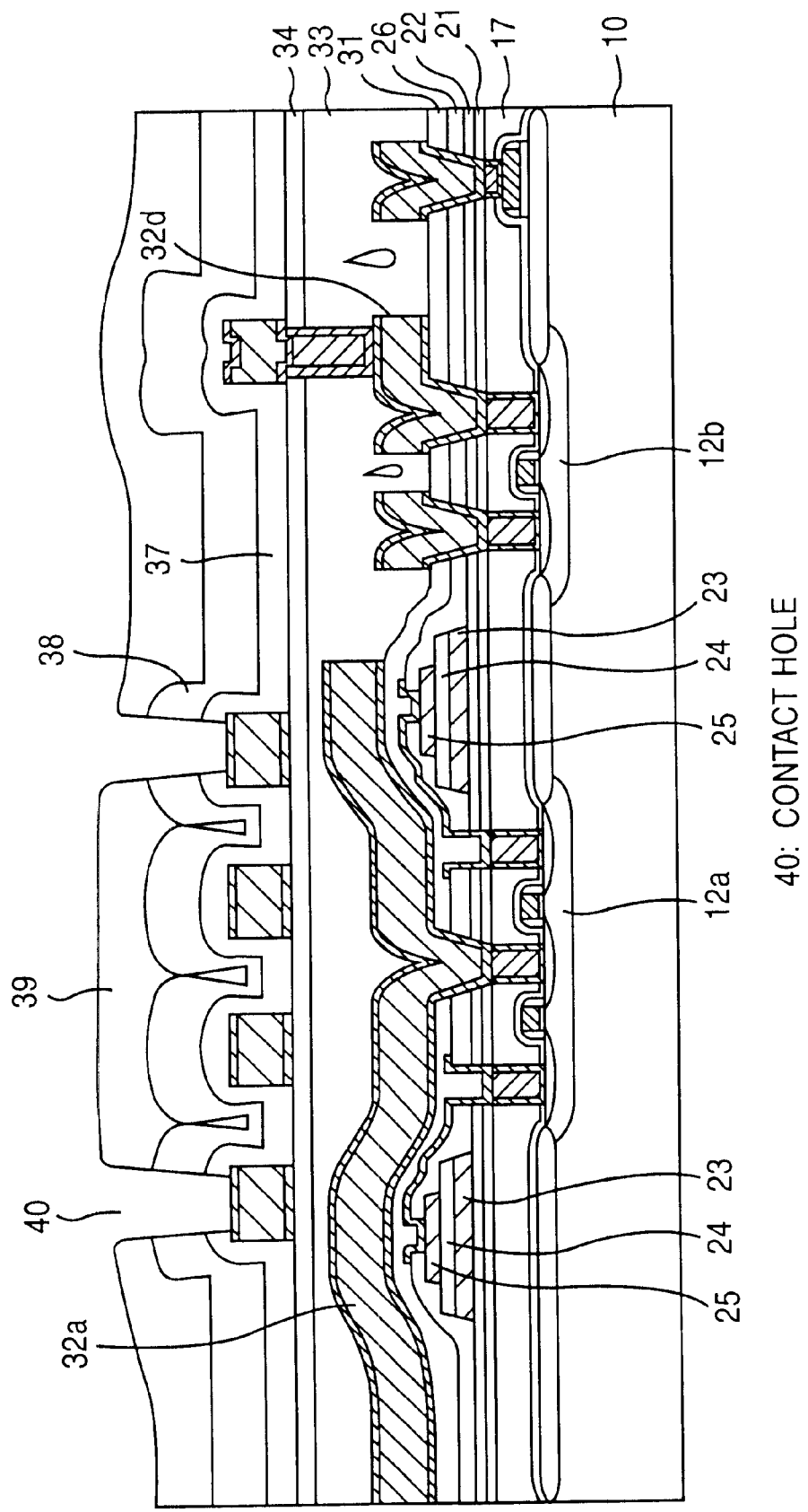

Next, a contact hole 40 is formed on the aluminum wiring layer 36 of the second layer by patterning the first to third passivation insulating films 37 to 39 using the photolithography method as illustrated in FIG. 18.

Figure 19:
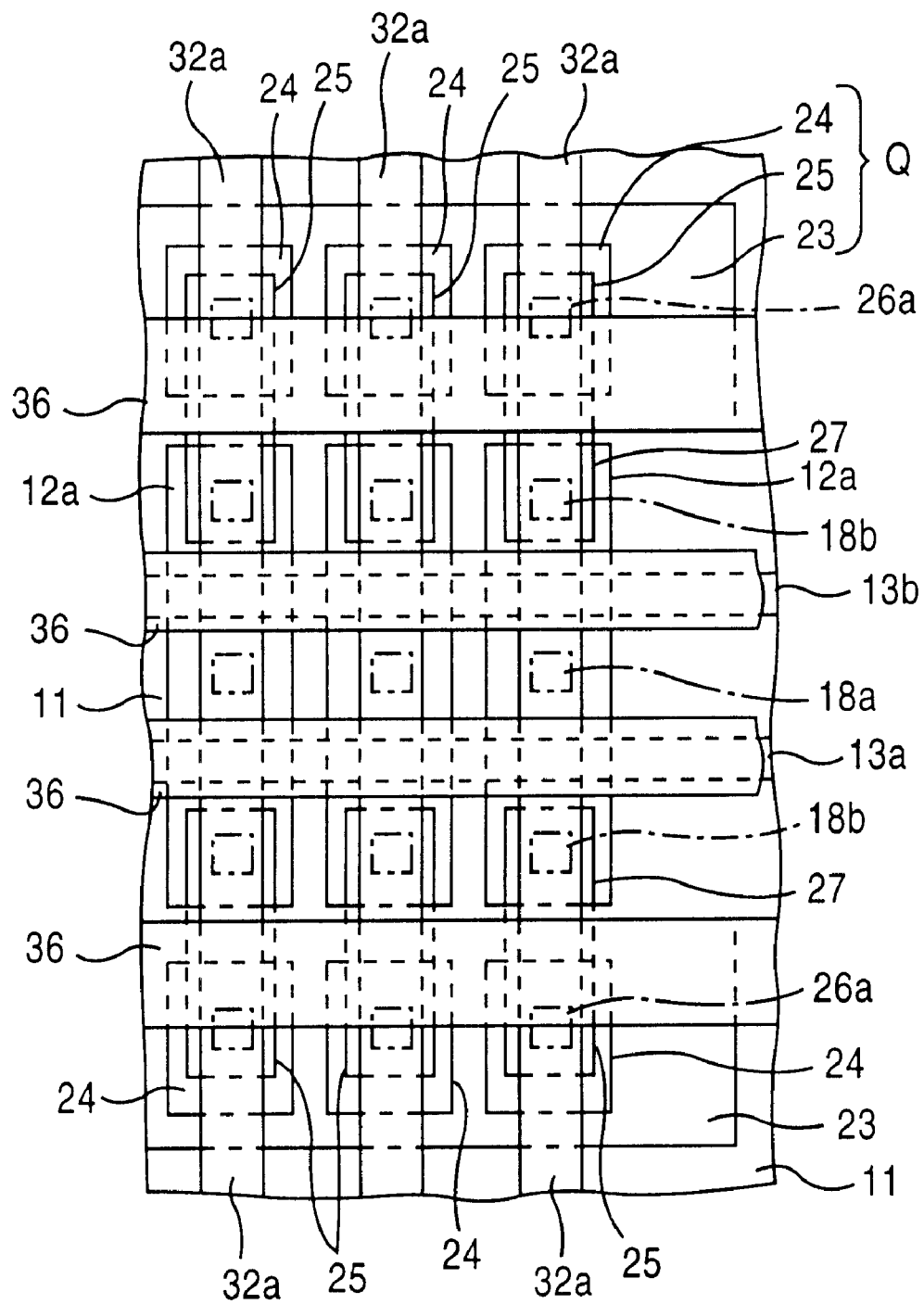
FIG. 19 is a plan view illustrating the layout of the conductive pattern in the memory cell region of a semiconductor device in the preferred embodiment of the present invention.

The positional relationship of various conductive patterns in the memory cell region 1 after formation of the aluminum wiring 36 of the second layer is illustrated in FIG. 19. Other than the element isolation insulating film 11, the insulating film and the contract hole 40 are omitted in FIG. 19.

The processes above explaines the basic structure of a FeRAM using ferroelectric material as the capacitor dielectric material 24.

In the present embodiment, the passivation film is formed with three-layers. The cavities formed in the silicon oxide film and the silicon nitride film of the lower film are perfectly covered by forming the TEOS-$O_3$ film of the upper layer. Thus, breakdown of the resist may be prevented. Moreover, close contact of the polyimide can also be improved.

Here, the inventor of the present invention have proven the following as a result of further development of the structure of the passivation film.

First, hydrogen tends to deteriorate the ferroelectric material used for the FeRAM. Namely, the characteristic of the ferroelectric capacitor are deteriorated from the hydrogen reducing the ferroelectric material. The moisture-proof test is effective. As a method of investigating deterioration of the ferroelectric capacitor.

On a silicon substrate, transistors and ferroelectric capacitors are formed via the interlayer insulating film. Thereafter, a Ti film with a thickness of 20 nm, a TiN film with a thickness of 50 nm, an Al—Cu(0.5%) layer in the thickness of 600 nm, a Ti film in the thickness of 10 nm and a TiN film in the thickness of 100 nm are laminated from the lower side on the interlayer insulating film of the upper layer. They are then patterned to form a wiring layer. On this wiring layer, a silicon oxide film with a thickness of 200 nm is formed as the first passivation film, using plasma enhanced CVD method with TEOS gas. Similarly, a silicon nitride film with a thickness of 500 nm is formed as the second passivation film, using the plasma enhanced CVD method, and a silicon oxide film with a thickness of 400 nm is formed as the third passivation film using the CVD method with $O_3$ and TEOS. They are sequentially laminated. Thereafter, a contact hole is formed on the first to third passivation films and they are packaged into a plastic package for the purpose of experiment.

The experimental conditions are set wherein the pressure is 2 atmospheric pressure, temperature is 121° C., humidity is 100% and bias is 5.5V. As a result of the moisture-proof test, a defective condition was generated after 168 hours. The defective condition is illustrated in FIG. 20.

Figure 20:
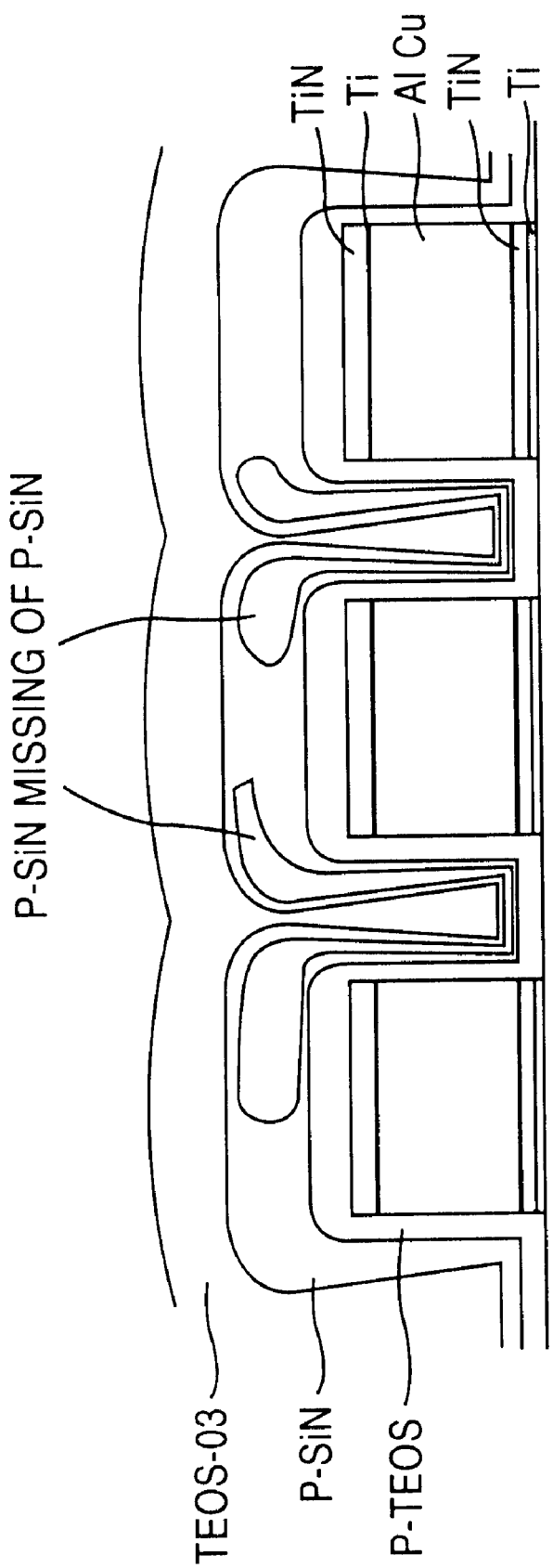
FIG. 20 is a cross-sectional view illustrating the passivation film structure.
Figure 21B:
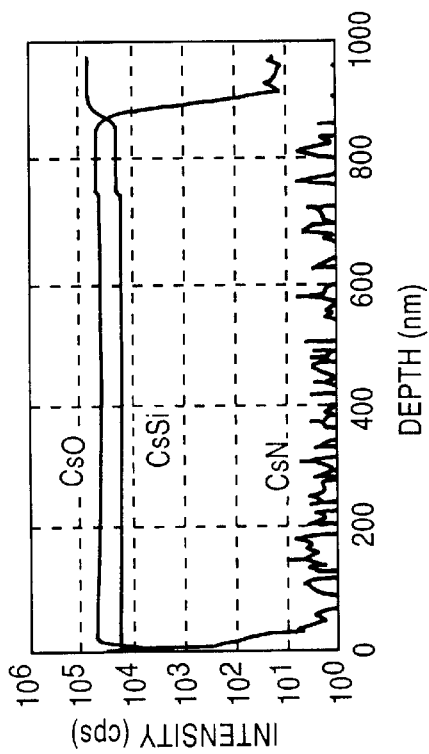
FIG. 21 is a diagram illustrating analysis result of SIMS.
Figure 21D:
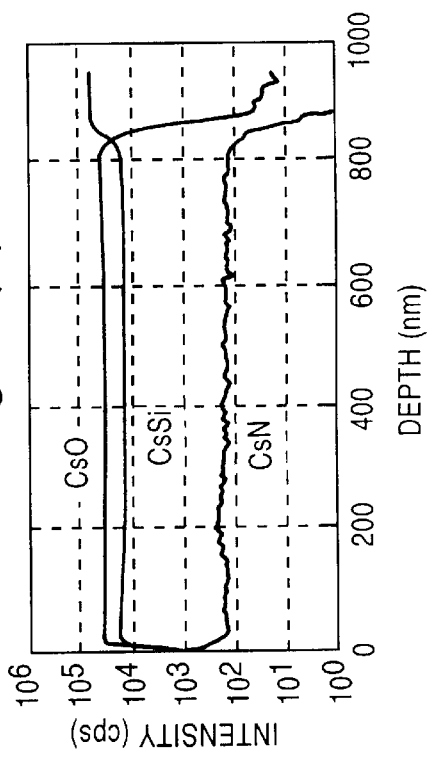
Figure 21A:
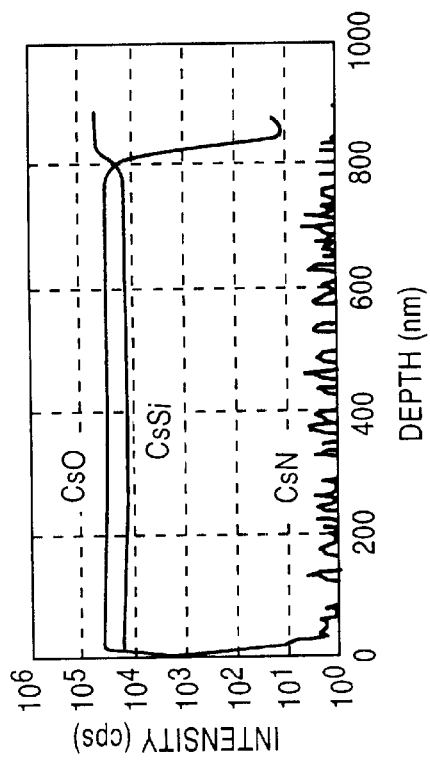
Figure 21C:
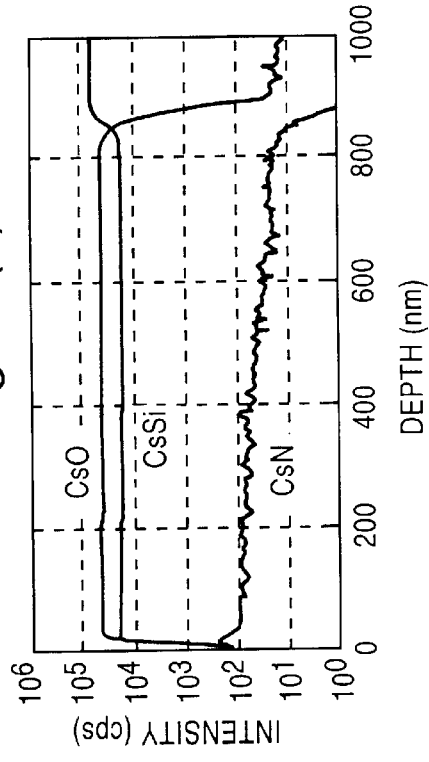

FIG. 20 illustrates the cross-sectional view of the passivation film structure. According to FIG. 20, it is thought that the silicon nitride film as the second passivation film disappears, and thereby the moisture-proof defective condition is generated. It is not clear why the silicon nitride film disappeared but the inventors of the present invention provide the following explanation.

First, the disappearance of the silicon nitride film is generated in the place where the interval of aluminum wirings is narrow. Where the interval of aluminum wirings is narrower than 0.6 μm or less, it is assumed that coverage of the silicon nitride film becomes faulty and film quality becomes substandard. Therefore, the TEOS-$O_3$ enters the region where the film quality is substandard. Thus, temperature, humidity and pressure affect the region. Accordingly, $H_2O$ existing in the TEOS-$O_3$ film is activated obtaining nitrogen from the silicon nitride film with substandard film quality. Thereby, the aqueous solution of alkali $NH_3$ is generated. Since high pressure creates high balanced ammonium concentration, it is assumed that when the high concentration $NH_3$ aqueous solution is in contact with the silicon nitride film, it decomposes to silicate and $NH_3$ and the decomposed $NH_3$ changes to the $NH_3$ aqueous solution. Accordingly, the concentration further increases allowing further corrosion.

Therefore, the inventors of the present invention have found, as a result of further investigation, that the disappearance of the silicon nitride film can be prevented to assure sufficient moisture-proof characteristic through the moisture-proof test by conducting the plasma process with the $N_2O$ gas to the silicon oxide film formed using the TEOS-$O_3$ as the third passivation film.

Table 1 shows the result of the comparison between the case where the $N_2O$ plasma annealing has been conducted for two minutes under the condition of a 350° C. temperature, a 700 sccm $N_2O$ flow rate, and a 200 sccm $N_2$ gas flow rate, and the case where such annealing has not been conducted.

TABLE 1

Moisture-proof Characteristic Comparison for $N_2O$-Plasma ANL Conducted/Not conducted (No. of defective Chips/No. of Chips measured)

| Conditions | 24 h | 48 h | 72 h | 96 h | 168 h |
|---|---|---|---|---|---|
| $N_2O$-plasma | 0/12 | 0/12 | 0/12 | 0/12 | 0/12 |
| No $N_2O$-plasma | 0/12 | 0/12 | 0/12 | 0/12 | 10/12 |

Here, the inventors think that the silicon nitride film can be prevented from disappearing by conducting the $N_2O$ plasma annealing to the third passivation film because of the following reasons.

Namely, the generation of $NH_3$ may be thought as being under control by reducing the $H_2O$ concentration in the silicon oxide film formed with the TEOS-$O_3$ through the $N_2O$ plasma annealing. Moreover, since nitrogen is introduced to the silicon oxide film formed with TEOS-$O_3$, moisture-proof characteristic of the third passivation film itself may be thought as being improved.

With respect, the plasma annealing time, 30 seconds or less cannot provide sufficient results. And if it is longer than 5 minutes, deterioration of capacitor due to degasification generated from interlayer film and diffusion of hydrogen from the nitride film is considered. Therefore, the preferred plasma annealing time should be selected within the range from 30 seconds to 5 minutes.

FIG. 21 illustrates the result of SIMS (Secondary Ion-Mass Spectrography). In detail, the silicon oxide film with a thickness of 800 nm is formed with TEOS-$O_3$ on the silicon substrate and thereafter plasma annealing is conducted using $N_2O$, $N_2$, $O_2$ gases to compare the amount of oxygen and hydrogen within the depth direction. According to FIG. 21, FIG. 21(a) illustrates the case where the plasma annealing is not conducted. FIG. 21(b) illustrates the case where $O_2$ gas is used, FIG. 21(c) shows the case where $N_2$ gas is used, and FIG. 21(d) shows the case where $N_2O$ gas is used. The vertical axis indicates the concentration of substance and the horizontal axis indicates the depth of sample.

Based on the results, when $N_2O$ and $N_2$ gases are used, nitrogen is introduced into the silicon oxide film. And when $N_2O$ is used, it appears that nitrogen is introduced uniformly in the depth direction of the silicon oxide film.

Figure 22:
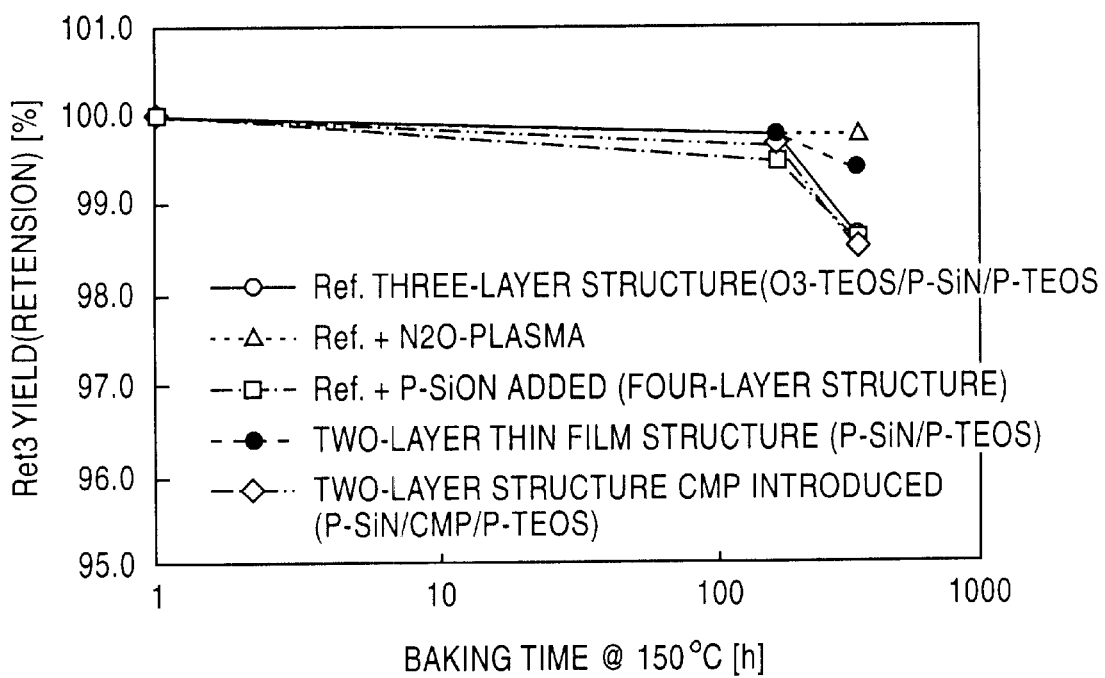
FIG. 22 is a diagram illustrating the dependence of retention characteristic on the passivation film.

Next, the inventors have investigated the retention characteristic of a ferroelectric capacitor depending on the differences of a passivation film. FIG. 22 illustrates the dependence on the passivation film concerning the retention characteristic and indicates the result of retention acceleration test of the device loading the ferroelectric capacitor. In practice and in this test, the information "1" is previously written to the capacitor, and thereafter, the device is baked under the temperature of 150° C. to certify whether the information "1" still exists or not.

In the figure, the vertical axis indicates the yield at the time of retention test, while the horizontal axis indicates the baking time.

According to the results of this test, the passivation structure obtained by conducting the $N_2O$ plasma annealing to the three-layer structure, as being the reference, does not yet deteriorate, in comparison with the other two-layer structure and 4-layer structure.

Moreover, in this embodiment, since the $N_2O$ plasma annealing is conducted at the temperature of 450° C. or less, the aluminum wiring never deteriorates. The investigation on the polarizing charge amount of the capacitor Q when the FeRAM is formed by introducing the $N_2O$ plasma annealing, or on the forming of the FeRAM by eliminating such annealing process, has proven that the $N_2O$ plasma annealing is effective for preventing deterioration of the capacitor.

Figure 23:
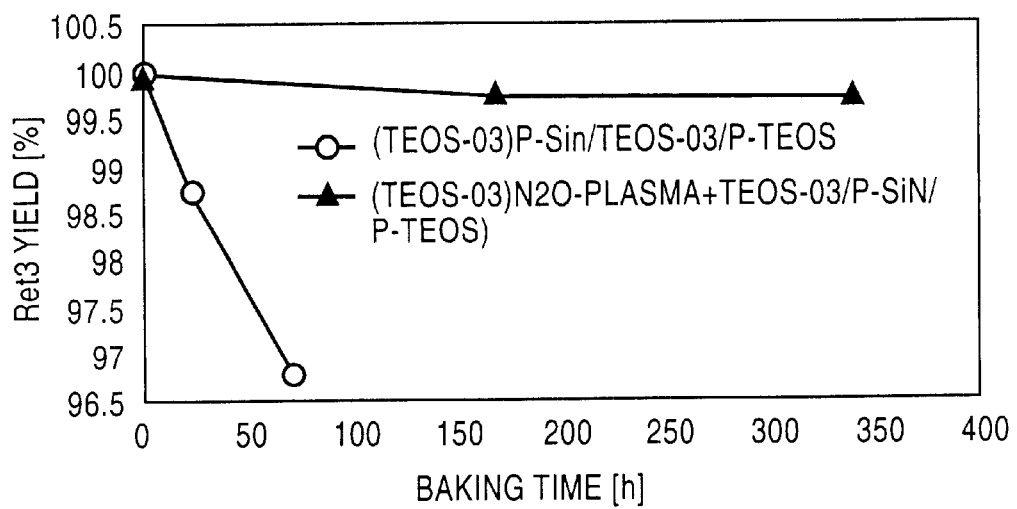
FIG. 23 is a diagram illustrating dependence of retention characteristic on the passivation film.

Moreover, the inventors of the present invention have investigated the retention characteristic of the ferroelectric capacitor due to the difference of passivation film forming sequence. FIG. 23 illustrates the dependence of retention characteristic on the passivation film and indicates the result of the retention acceleration test of the device loading the ferroelectric capacitor. In practice, the information "1" is previously written and then the baking is conducted under the temperature of 150° C. to check whether the information "1" still exists or not. In the figure, the vertical axis indicates the yield when the retention test is conducted, while the horizontal axis indicates the baking time.

Based on this result, it is proven that when the TEOS-$O_3$ is formed on the P-SIN, retention characteristic can be improved. However, but when the TEOS-$O_3$ is formed under the P-SIN, deterioration is very much accelerated.

In above embodiment, the dehydration process is performed to the third passivation film 39 with the plasma annealing using $N_2O$, but the gas used for dehydration process is not limited to only $N_2O$. For example, a similar effect can also be attained with the plasma annealing using the $N_2$ gas, $O_2$ gas or NO gas. In addition, the mixed gases such as $N_2O+N_2$, $N_2+O_2$ or the like may also be used as the gas for the plasma annealing. Moreover, it is also possible to mix, for the purpose of getting plasma thereof, the inert gas such as argon (Ar), helium (He), neon (Ne) to the simple gas or a mixed gas.

Moreover, in this embodiment, the three-layer passivation film consisting of; the P-TEOS film, the plasma nitride film, the silicon oxide film, formed by TEOS-$O_3$, are laminated from the lower side. However, the lowest layer P-TEOS film is not always laminated. It is also possible to introduce the two-layer structure of the plasma nitride film and the silicon oxide film formed with the TEOS-$O_3$. When the silicon nitride film, with high stress, is formed directly on the wiring layer, stress migration of the wiring layer is considered a problem. Therefore, it is preferable to form the silicon oxide film as the lowest layer. In addition, it is also possible to use, the silicon oxide film (TEOS-$O_3$ film) formed using ozone ($O_3$) and TEOS with the thermal CVD method, the $SiO_2$ (P—$SiO_2$) film formed using the plasma enhanced CVD method, and the $SiO_2$ film formed using the CVD method with the non-biased HDP (High Density Plasma) in place of the TEOS film (P-TEOS film) formed using the plasma enhanced CVD method explained above. However, since the TEOS-$O_3$ includes much more moisture than the P-TEOS film, the P-TEOS film is used in this embodiment.

In the embodiment explained above, the FeRAM and its forming process have been explained. However, in regard to the volatile memory (DRAM) including the high dielectric capacitor, breakdown occurs at the passivation film. The insulation characteristic of the high dielectric material deteriorates due to moisture and heat treatment. Additionally, the interface between the high dielectric material and the electrode easily deteriorates. Therefore, as explained above, it is recommended to, 1)form a passivation film of a three-layer structure, 2) almost flattened the upper most surface, and 3) conduct a dehydration process of the TEOS-$O_3$ film at the surface using the gas such as $N_2O$, NO or the like. High dielectric material such as (BaSr)$TiO_3$ may be used.

Moreover, the present invention can also be applied to the manufacture of a so-called LSI system loading a ferroelectric non-volatile semiconductor memory or a high dielectric semiconductor memory and a logic device.

As explained above, since the dehydration process (consisting of plasma annealing with $N_2O$ or NO) is performed for the polished insulating film, the moisture adhered to the surface of the insulating film and the moisture entering the insulating film can be removed more effectively. Accordingly, reduction of the ferroelectric material or high dielectric material forming the capacitor or deterioration of such capacitor, can be prevented. Therefore, deterioration of the dielectric characteristic of the ferroelectric material or high dielectric material can be eliminated and the FeRAM or the DRAM with excellent characteristic can be manufactured.

What is claimed is:
1. A semiconductor device comprising:
   a transistor having a first impurity region and a second impurity region and a gate electrode formed on a semiconductor substrate;
   a first insulating film covering the transistor;
   a capacitor formed on the first insulating film,
   wherein the capacitor having a dielectric film formed of ferroelectric material, and a upper electrode and a lower electrode positioned to put the dielectric film therebetween;
   a second insulating film formed on the capacitor;
   a wiring layer formed on the second insulating film;
   a nitride film covering the wiring layer and the capacitor; and
   a first silicon oxide film formed on the nitride film having nitrogen at least at the surface thereof.
2. The semiconductor device according to claim 1, wherein the capacitor having a dielectric film is formed with high dielectric material.

3. The semiconductor device according to claim 1, wherein a second silicon oxide film is further provided between the wiring layer and the nitride film.
4. The semiconductor device according to claim 3, wherein the second silicon oxide film includes nitrogen at least at the surface thereof.
5. The semiconductor device according to claim 3, wherein the first silicon oxide film is flatter than the second silicon oxide film.
6. A semiconductor device comprising:
   a transistor having a first impurity region and a second impurity region and a gate electrode formed on a semiconductor substrate;
   a first insulating film covering the transistor;
   a capacitor formed on the first insulating film,
   wherein the capacitor having a dielectric film formed of ferroelectric material, and a upper electrode and a lower electrode positioned to put the dielectric film therebetween;
   a second insulating film formed on the capacitor;
   a wiring layer formed on the second insulating film; and
   a passivation film covering the wiring layer,
   wherein the passivation film includes a first silicon oxide film, a nitride film formed on the first silicon oxide film and the capacitor, and a second silicon oxide film formed on the nitride film.
7. The semiconductor device according to claim 6, wherein the capacitor having a dielectric film is formed with high dielectric material.
8. A semiconductor device according to claim 6, wherein the second silicon oxide film is flatter than the first silicon oxide film.
9. A semiconductor device comprising:
   a transistor having a first impurity region and a second impurity region and a gate electrode formed on a semiconductor substrate;
   a first insulating film covering the transistor;
   a capacitor formed on the first insulating film,
   wherein the capacitor having a dielectric film formed of ferroelectric material, and a upper electrode and a lower electrode positioned to put the dielectric film therebetween;
   a second insulating film formed on the capacitor;
   a wiring layer formed on the second insulating film;
   a nitride film covering the wiring layer and the capacitor; and
   a first silicon oxide film formed on the nitride film having nitrogen at the surface and in an inner side thereof.
10. The semiconductor device according to claim 9, wherein the capacitor having a dielectric film is formed with high dielectric material.
11. The semiconductor device according to claim 9, wherein a second silicon oxide film is further provided between the wiring layer and the nitride film.
12. The semiconductor device according to claim 11, wherein the second silicon oxide film includes nitrogen at least at the surface thereof.
13. The semiconductor device according to claim 11, wherein the first silicon oxide film is flatter than the second silicon oxide film.
14. The semiconductor device according to claim 9, wherein the surface of the second insulating film is flattened.

* * * * *